US012787593B2

(12) United States Patent
Lim

(10) Patent No.: US 12,787,593 B2
(45) Date of Patent: Nov. 3, 2026

(54) LIGHT EMITTING DISPLAY DEVICE

(71) Applicant: LG Display Co., Ltd., Seoul (KR)

(72) Inventor: Hyeongjun Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 464 days.

(21) Appl. No.: 18/479,972

(22) Filed: Oct. 3, 2023

(65) Prior Publication Data

US 2024/0224695 A1 Jul. 4, 2024

(30) Foreign Application Priority Data

Dec. 28, 2022 (KR) ........................ 10-2022-0187518

(51) Int. Cl.

| | |
|---|---|
| ***H10K 59/38*** | (2023.01) |
| ***H10K 59/122*** | (2023.01) |
| ***H10K 59/80*** | (2023.01) |
| *H10K 102/00* | (2023.01) |

(52) U.S. Cl.

CPC ........... *H10K 59/38* (2023.02); *H10K 59/122* (2023.02); *H10K 59/873* (2023.02); *H10K 59/877* (2023.02); *H10K 59/879* (2023.02); *H10K 59/8792* (2023.02); *H10K 2102/3026* (2023.02); *H10K 2102/351* (2023.02)

(58) Field of Classification Search

CPC .... H10K 59/38; H10K 59/122; H10K 59/873; H10K 59/877; H10K 59/879; H10K 59/8792; H10K 2102/3026; H10K 2102/351; H10K 50/854; H10K 50/858; H10K 50/844; H10K 50/865

USPC .................................................. 313/498–512

See application file for complete search history.

(56) References Cited

U.S. PATENT DOCUMENTS

| | | | | |
|---|---|---|---|---|
| 2018/0151842 | A1* | 5/2018 | Park | H10K 59/8792 |
| 2019/0172874 | A1 | 6/2019 | Lim et al. | |
| 2022/0352419 | A1 | 11/2022 | Yang et al. | |
| 2023/0086115 | A1* | 3/2023 | Takagi | H10K 50/858 257/40 |

FOREIGN PATENT DOCUMENTS

| | | | |
|---|---|---|---|
| KR | 10-2015-0002252 | A | 1/2015 |
| KR | 10-2018-0045887 | A | 5/2018 |
| KR | 10-2018-0078805 | A | 7/2018 |
| KR | 10-2019-0047668 | A | 5/2019 |
| KR | 10-2019-0066359 | A | 6/2019 |
| KR | 10-2020-0025980 | A | 3/2020 |
| KR | 10-2020-0051883 | A | 5/2020 |
| KR | 10-2022-0149878 | A | 11/2022 |

* cited by examiner

*Primary Examiner* — Christopher M Raabe

(74) *Attorney, Agent, or Firm* — Birch, Stewart, Kolasch & Birch, LLP

(57) ABSTRACT

Discussed is a light emitting display device that can include a substrate including a pixel; a driving element layer including a thin film transistor disposed in the pixel; a light emitting element layer disposed in the pixel on the driving element layer, and connected to the thin film transistor; an encapsulation layer on the light emitting element layer; a color filter having a lens shape and disposed on the encapsulation layer at the pixel, wherein an empty space is located at a side of the color filter; and a transparent layer on the color filter.

21 Claims, 19 Drawing Sheets

LIGHT EMITTING DISPLAY DEVICE

CROSS-REFERENCE TO RELATED APPLICATIONS

This application claims priority to Korean Patent Application No. 10-2022-0187518 filed in the Republic of Korea on Dec. 28, 2022, the entire disclosure of which is hereby expressly incorporated by reference into the present application.

BACKGROUND

Field of the Invention

The present disclosure relates to a light emitting display device configured to prevent or minimize color leakage and color mixing among the pixels of the display device.

Discussion of the Related Art

A head mount display (HMD) including an organic light emitting diode display has been developed and is being continuously improved. The HMD is a wearable monitor device for virtual reality (VR) or augmented reality (AR) that is worn by a user in the form of glasses or a helmet so it can be used to focus on a distance close to the user's eyes. Such a head-mounted display can be equipped with a small organic light emitting diode display with high resolution property.

Particularly, in an ultra-high density resolution display device having a pixel density of 4K (ppi: pixel per inch) or more, a distance between pixels is rather very narrow, so that color mixing can occur between neighboring pixels, which can cause an image quality to deteriorate. Furthermore, since a size of an individual pixel is very small, structural improvement for improving light efficiency can be needed to provide a brighter and clearer image quality with the same power consumption in the HMD.

SUMMARY OF THE DISCLOSURE

One purpose of the present disclosure, as for solving or addressing the limitations described above, is to provide a top emission type light emitting display device or a top emission type transparent light emitting display device having high luminance compared to power consumption.

Some embodiments of the present disclosure can be directed to providing a top emission type light emitting display device or a top emission type transparent light emitting display device having a structure capable of preventing color mixing or light leakage between pixels including the light emitting diode.

Some embodiments of the present disclosure can be directed to providing a top emission type light emitting display device or a top emission type transparent light emitting display device capable of low power driving with higher luminance with the same power consumption by including a color filter having a structure capable of improving light efficiency.

In order to accomplish the above mentioned purposes of the present disclosure, a light emitting display device according to the present disclosure includes a substrate including a pixel; a driving element layer including thin film transistor disposed in the pixel; a light emitting element layer disposed in the pixel on the driving element layer, and connected to the thin film transistor; an encapsulation layer on the light emitting element layer; a color filter having lens shape at the pixel on the encapsulation layer; an air layer disposed at side of the color filter; and a transparent layer on the color filter.

In an example embodiment, the color filter has any one of a trapezoidal shape, a semi-circular shape and a semi-elliptical shape in which a lower surface is wider than an upper surface.

In an example embodiment, the color filter includes a lower surface contacting the encapsulation layer, and having a first area; and a second surface contacting the transparent layer, and having a second area smaller than the first area.

In an example embodiment, the color filter further includes a side surface connecting the lower surface to the upper surface, and forming an acute angle with the lower surface.

In an example embodiment, the transparent layer has a refractive index between a refractive index of color filter and a refractive index of the air layer.

In an example embodiment, the light emitting display device further includes a black matrix overlapping a lower edge side of the color filter on the encapsulation layer.

In an example embodiment, the transparent layer further includes at least one of a light scattering pattern and a light scattering material.

In an example embodiment, the light emitting display device further includes an upper protection layer on the transparent layer.

In an example embodiment, the upper protection layer has a refractive index between a refractive index of transparent layer and a refractive index of the air layer.

In an example embodiment, the light emitting display device further includes a filling layer that fills inside of the air layer.

In an example embodiment, the filling layer has a refractive index less than refractive indices of the color filter and the transparent layer.

Furthermore, a light emitting display device according to the present disclosure includes a substrate including a first pixel and a second pixel disposed adjacent to each other; a first color filter disposed at the first pixel on the substrate; a second color filter disposed at the second pixel on the substrate, and spaced apart from the first color filter; a first transparent layer on the first color filter; a second transparent layer on the second color filter; and an air layer between the first color filter and the second color filter.

In an example embodiment, the first transparent layer and the second transparent layer have refractive indices between refractive indices of the first color filter and the second color filter and a refractive index of the air layer.

In an example embodiment, the light emitting display device further includes a black matrix between the first color filter and the second color filter on the substrate.

In an example embodiment, the light emitting display device further includes a link portion connecting the first transparent layer and the second transparent layer.

In an example embodiment, the link portion has a width of 20% to 30% compared to a length of sides of the first transparent layer and the second transparent layer facing each other.

In an example embodiment, the first transparent layer and the second transparent layer include at least one of a light scattering pattern and a light scattering material.

In an example embodiment, the light emitting display device further includes an upper protection layer continuously disposed over upper surfaces of the first transparent layer and the second transparent layer.

In an example embodiment, the light emitting display device further includes a filling layer that fills the air layer between the first color filter and the second color filter, and under the first transparent layer and the second transparent layer.

In an example embodiment, the filling layer has a refractive index between refractive indices of the first transparent layer and the second transparent layer and a refractive index of the air layer.

In an example embodiment, the light emitting display device further includes an encapsulation layer between the substrate and the first color filter, and between the substrate and the second color filter; a trench formed at the encapsulation layer between the first pixel and the second pixel; and a recessed dam disposed at a bottom surface and an inside side surface of the trench.

The light emitting display device according to one or more aspects of the present disclosure includes a color filter having a light condensing structure such as a micro lens, so that light extraction efficiency can be enhance or maximized. Even in an ultra-high density resolution display device having very small size of the emission area, higher luminance can be provided with the same power consumption. Accordingly, the low power driving can be implemented.

The light emitting display device according to one or more aspects of the present disclosure has a structural feature in which air or a low refractive layer is disposed between color filters, so it can prevent leakage or diffusion of light to neighboring pixels. Therefore, even in an ultra-high resolution display device in which the distance between pixels is narrowed, color mixing does not occur between neighboring pixels.

In addition to the effects of the present disclosure mentioned above, other features and advantages of the present disclosure are described below, or can be clearly understood by those skilled in the art from such descriptions and explanations.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
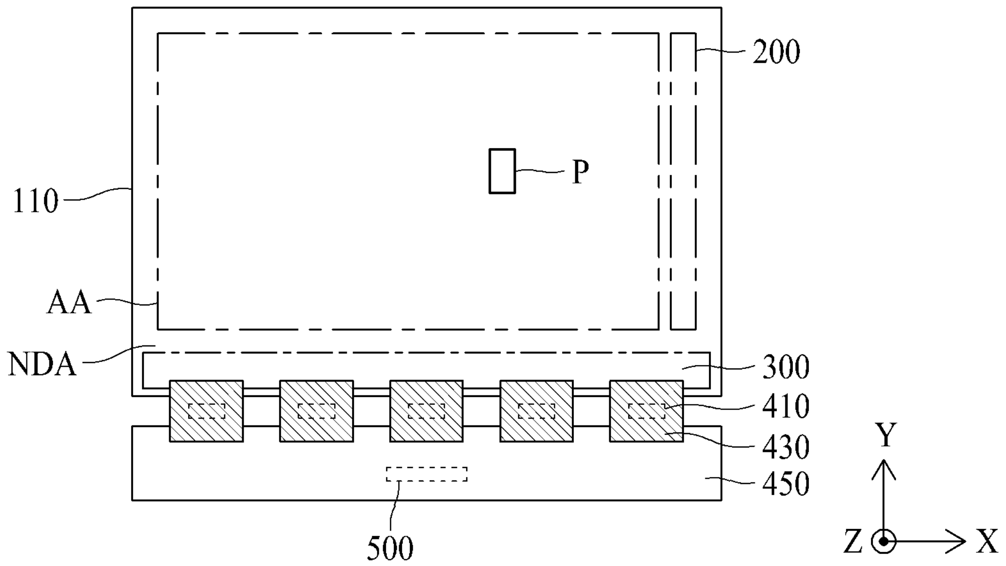
FIG. 1 is a plane view illustrating a schematic structure of a light emitting display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration can unnecessarily obscure an important point of the present disclosure, a detailed description of such known function of configuration can be omitted.

Reference will now be made in detail to the example embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the present specification, where the terms "comprise," "have," "include," and the like are used, one or more other elements can be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" or "over" another element or layer, one or more third/additional layer(s) or element(s) can be interposed therebetween. Further, if a first element is described as positioned "on" or "over" a second element, it does not necessarily mean that the first element is positioned above the second element in the figure. The upper part and the lower part of an object concerned can be changed depending on the orientation of the object. Consequently, where a first element is described as positioned "on" a second element, the first element can be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous can be included unless a more limiting term, such as "just," "immediate(ly)," or "direct(ly)," is used.

It will be understood that, although the terms "first," "second," and the like can be used herein to describe various elements, these elements should not be limited by these terms as they are not used to define a particular order or sequence. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) can be used. These terms are used merely to distinguish one element from another, and not to define a particular nature, order, sequence, or number of the elements. Where an element is described as being "linked", "coupled," or "connected" to another element, that element can be directly or indirectly connected to that other element unless otherwise specified. It is to be understood that additional element or elements can be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts.

Hereinafter, referring to the attached figures, the present disclosure will be explained. Since a scale of each of elements shown in the accompanying drawings can be different from an actual scale for convenience of description, the present disclosure is not limited to the scale shown in the drawings. All components of each light emitting display device according to all embodiments of the present disclosure are operatively coupled and configured.

FIG. 1 is a plane view illustrating a schematic structure of a light emitting display device (e.g., electroluminescence display device) according to an embodiment of the present disclosure. In FIG. 1, X-axis refers to the direction parallel to the scan line, Y-axis refers to the direction of the data line, and Z-axis refers to the height direction of the display device, but other variations are possible.

Referring to FIG. 1, the light emitting display device comprises a substrate 110, a gate (or scan) driver 200, a pad portion 300, a source driving IC (Integrated Circuit) 410, a flexible circuit film 430, a circuit board 450, and a timing controller 500.

The substrate 110 can include an electrical insulating material or a flexible material. The substrate 110 can be made of a glass, a metal or a plastic, but embodiments of the present disclosure are not limited thereto. When the light emitting display device is a flexible display, the substrate 110 can be made of the flexible material such as plastic. For example, the substrate 110 can include a transparent polyimide material.

The substrate 110 can include a display area (active area) AA and a non-display area NDA (non-active area). The display area AA, which is an area for representing the video images, can be defined as the majority middle area of the substrate 110, but embodiments of the present disclosure are not limited thereto. In the display area AA, a plurality of pixels P are arrayed in a matrix manner. Further, a plurality of scan lines (or gate lines), a plurality of data lines can be disposed as crossing each other. Each of pixels P can be disposed at the crossing area of the scan line SL running to X-axis and the data line running to Y-axis.

Here, the pixel P can represent any one of color among red, green and blue or red, green, blue or white. A red pixel, a green pixel and a blue pixel can be gathered or a red pixel, a green pixel, a blue pixel and a white pixel can be gathered to form one unit pixel. For example, each of the pixels representing each color can be called as a 'sub-pixel', and it can be explained that these 'sub-pixels' form one 'pixel'. As another example, it can be explained that pixels representing each color are called as 'pixels P', and three or four of these 'pixels P' are gathered to form one 'unit pixel'. Hereinafter, the latter case will be described.

The non-display area NDA, which is an area not representing the video images, can be defined at the circumference areas of the substrate 110 surrounding all or some of the display area AA. In the non-display area NDA, the gate driver 200 and the pad portion 300 can be formed or disposed.

The gate driver 200 can supply the scan (or gate) signals to the scan lines according to the gate control signal received from the timing controller 500 through the pad portion 300. The gate driver 200 can be formed at the non-display area NDA at any one outside of the display area DA on the substrate 110, as a GIP (Gate driver In Panel) type. GIP type means that the gate driver 200 is directly formed on the substrate 110. For example, the gate driver 200 can be configured with shift registers. In the GIP type, the transistors for shift registers of the gate driver 200 are directly formed on the upper surface of the substrate 110.

The pad portion 300 can be disposed in the non-display area NDA at one side edge of the display area AA of the substrate 110. The pad portion 300 can include data pads connected to each of the data lines, driving current pads connected to the driving current lines, a high-potential pad receiving a high potential voltage, and a low-potential pad receiving a low potential voltage.

The source driving IC 410 can receive the digital video data and the source control signal from the timing controller 500. The source driving IC 410 can convert the digital video data into the analog data voltages according to the source control signal and then supply that to the data lines. When the source driving IC 410 is made as a chip type, it can be installed on the flexible circuit film 430 as a COF (Chip On Film) or COP (Chip On Plastic) type. But embodiments of the present disclosure are not limited thereto.

The flexible circuit film 430 can include a plurality of first link lines connecting the pad portion 300 to the source driving IC 410, and a plurality of second link lines connecting the pad portion 300 to the circuit board 450. The flexible circuit film 430 can be attached on the pad portion 300 using an anisotropic conducting film, so that the pad portion 300 can be connected to the first link lines of the flexible circuit film 430.

The circuit board 450 can be attached to the flexible circuit film 430. The circuit board 450 can include a plurality of circuits implemented as the driving chips. For example, the circuit board 450 can be a printed circuit board or a flexible printed circuit board.

The timing controller 500 can receive the digital video data and the timing signal from an external system board through the line cables of the circuit board 450. The timing controller 500 can generate a gate control signal for controlling the operation timing of the gate driver 200 and a source control signal for controlling the source driving IC 410, based on the timing signal. The timing controller 500 can supply the gate control signal to the gate driver 200 and supply the source control signal to the source driving IC 410. Depending on the product types, the timing controller 500 can be integrated with the source driving IC 410 into one driving chip and can be mounted on the substrate 110 to be connected to the pad unit 300.

Figure 2:
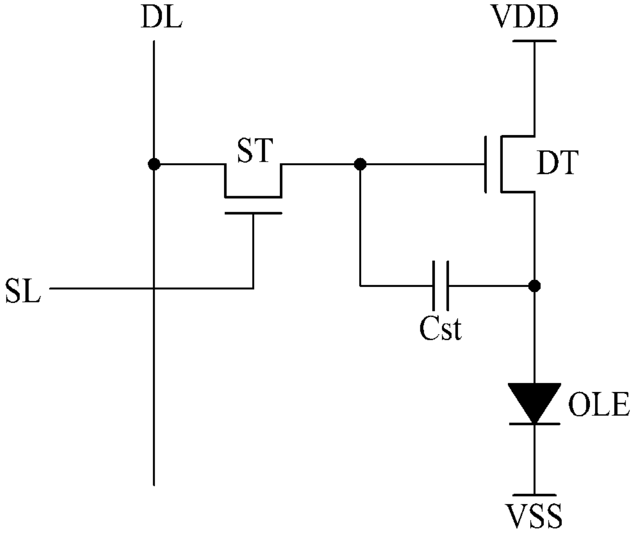
FIG. 2 is a circuit diagram illustrating a structure of one pixel disposed in a light emitting display device according to an embodiment of the present disclosure.
Figure 3:
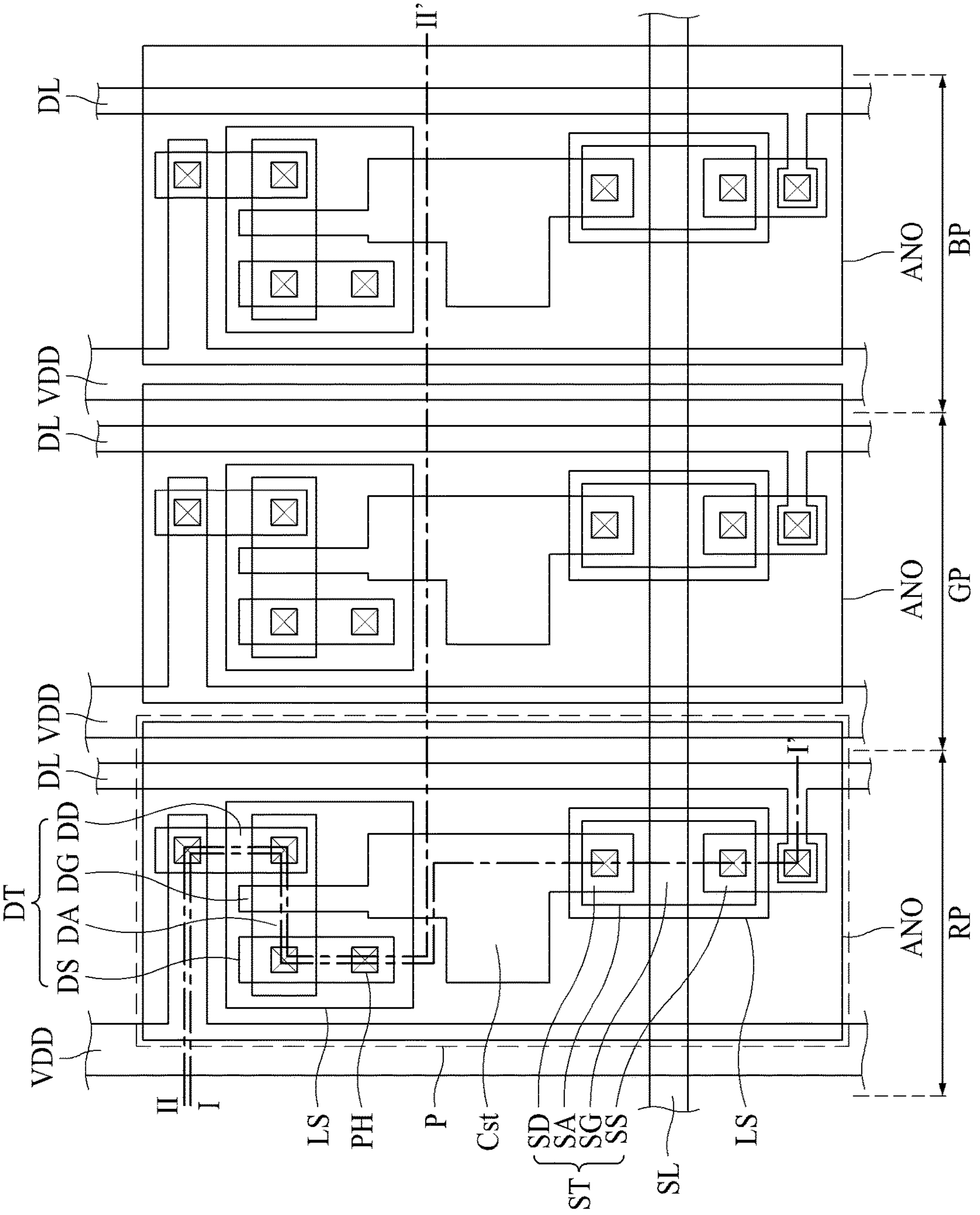
FIG. 3 is an enlarged plan view illustrating a structure of three pixels sequentially disposed in the light emitting display device according to an embodiment of the present disclosure.

Hereinafter, referring to FIGS. 2 to 5, a detailed structure of a light emitting display device according to an embodiment of the present disclosure will be explained. FIG. 2 is a circuit diagram illustrating a structure of one pixel disposed in a light emitting display device according to an embodiment of the present disclosure. FIG. 3 is an enlarged plan view illustrating a structure of three pixels sequentially disposed in the light emitting display device according to an embodiment of the FIGS. of the present disclosure.

Referring to FIGS. 2 to 3, each pixel P of the light emitting display according to the present disclosure can be defined by a scan line SL, a data line DL and a driving current line VDD. Each pixel P of the light emitting display can include a switching thin film transistor ST, a driving thin film transistor DT, a light emitting diode OLE and a storage capacitance Cst. The driving current line VDD can be supplied with a high-level voltage for driving the light emitting diode OLE.

A switching thin film transistor ST and a driving thin film transistor DT can be formed on a substrate 110. For example, the switching thin film transistor ST can be configured to be connected to the scan line SL and the data line DL is crossing. The switching thin film transistor ST can include a gate electrode SG, a semiconductor layer SA, a source electrode SS and a drain electrode SD. The gate electrode SG can be a portion of the scan line SL. The semiconductor layer SA can be disposed as crossing the gate electrode SG. The overlapped portion of the semiconductor layer SA with the gate electrode SG can be defined as the channel area. The source electrode SS can be branched from or connected to the data line DL, and the drain electrode SD can be connected to the driving thin film transistor DT. The source electrode SS can be one side of the semiconductor layer SA from the channel area, and the drain electrode SD can be the other side of the semiconductor layer SA. By supplying the data signal to the driving thin film transistor DT, the switching thin film transistor ST can play a role of selecting a pixel which would be driven.

The driving thin film transistor DT can play a role of driving the light diode OLE of the selected pixel by the switching thin film transistor ST. The driving thin film transistor DT can include a gate electrode DG, a semiconductor layer DA, a source electrode DS and a drain electrode DD. The gate electrode DG of the driving thin film transistor DT can be connected to the drain electrode SD of the switching thin film transistor ST. For example, the gate electrode DG of the driving thin film transistor DT can be extended form the drain electrode SD of the switching thin film transistor ST. In the driving thin film transistor DT, the drain electrode DD can be branched from or connected to the driving current line VDD, further, the source electrode DS can be connected to the anode electrode (or pixel electrode) ANO of the light emitting diode (or light emitting element) OLE. The semiconductor layer DA can be disposed as crossing over the gate electrode DG. In the semiconductor layer DA, the overlapped portion with the gate electrode DG can be defined as a channel area. The source electrode DS can be connected at one side of the semiconductor layer DA around the channel area, and the drain electrode DD is connected to the other side of the semiconductor layer DA. A storage capacitance Cst can be disposed between the gate electrode DG of the driving thin film transistor DT and the anode electrode ANO of the light emitting diode OLE.

The light emitting diode OLE can generate light according to the current controlled by the driving thin film transistor DT. The driving thin film transistor DT can control the amount of current flowing from the driving current ling VDD to the light emitting diode OLE according to the voltage difference between the gate electrode DG and the source electrode DS.

The light emitting diode OLE can include an anode electrode ANO, an emission layer EL, and a cathode electrode CAT. The light emitting diode OLE can emit lights according to the current controlled by the driving thin film transistor DT. In other words, the light emitting diode OLE can provide an image by emitting light according to the current controlled by the driving thin film transistor DT. The anode electrode ANO of the light emitting diode OLE can be connected to the source electrode DS of the driving thin film transistor DT. The cathode electrode CAT (or, common electrode) can be low-power line VSS supplied with the low-potential voltage. Therefore, the light emitting diode OLE can be driven by the electric current flown from the driving current line VDD to the low power line VSS controlled by the driving thin film transistor DT.

A plurality of pixels P can be arrayed on the substrate 110. For example, along the horizontal direction, a red pixel RP, a green pixel GP and a blue pixel BP can be sequentially arrayed and disposed. The combination of the red pixel RP, the green pixel GP and the blue pixel BP can configure one pixel. In another case, the red pixel, the green pixel, the white pixel and the blue pixel can be sequentially arrayed along the horizontal direction. The red pixel, the green pixel, the white pixel and the blue pixel can form a unit pixel. FIG. 3 shows that three pixels P sequentially are arrayed along the horizontal direction.

Figure 4:
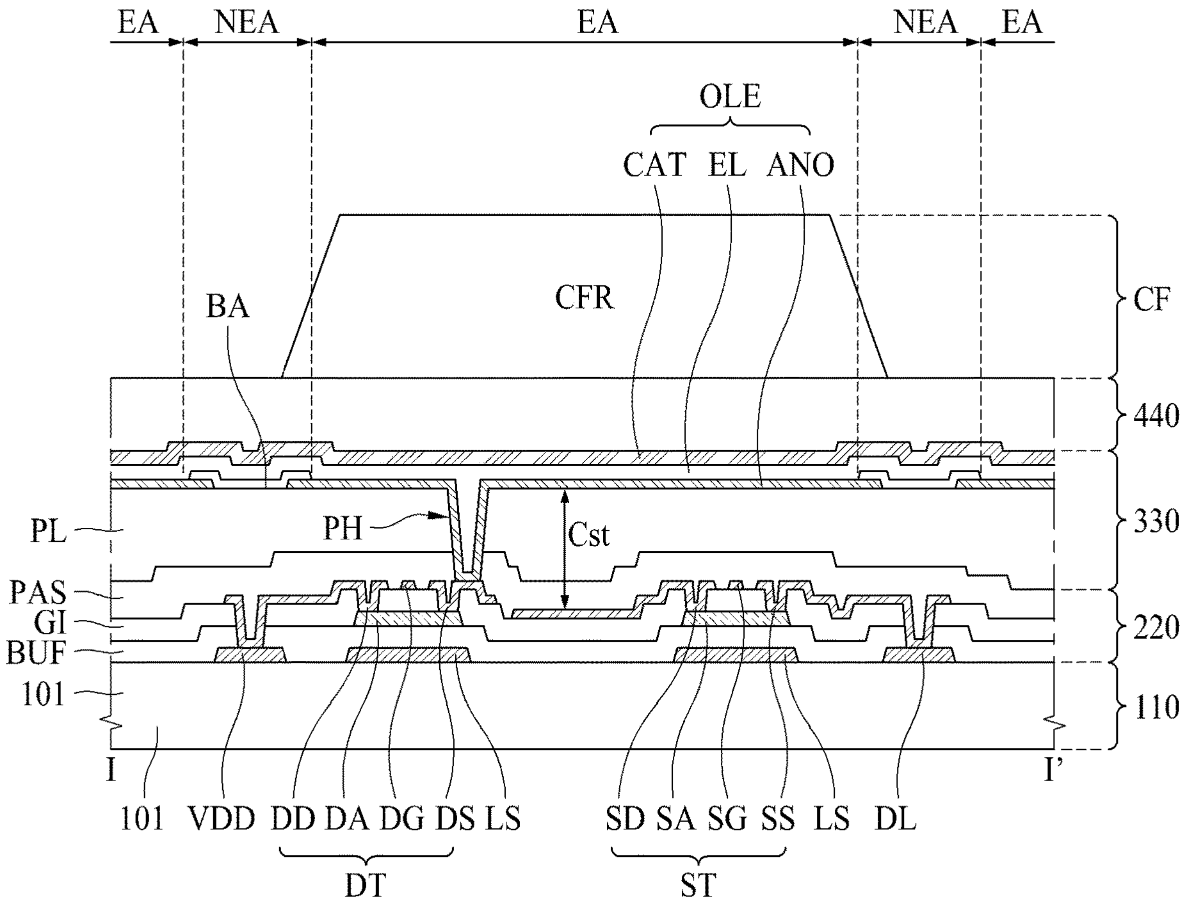
FIG. 4 is a cross-sectional view along to cutting line I-I' in FIG. 3, for illustrating a structure of one pixel in a light emitting display device according to an embodiment of the present disclosure.

Further referring to FIG. 4, a cross-sectional structure of the light emitting display device according to the present disclosure will be explained. FIG. 4 is a cross-sectional view along to cutting line I-I' in FIG. 3, for illustrating a structure of one pixel in a light emitting display device according to an embodiment of the present disclosure. A light emitting display device can include a substrate 110, a driving element layer 220 and a light emitting element layer 330. The driving element layer 220 can include a plurality of thin layers formed on the substrate 110. The driving element layer 220 can include a switching thin film transistor ST and a driving thin film transistor DT.

On the substrate 110, a data line DL, a driving current line VDD and a light shielding layer LS can be formed. The light shielding layer LS can be disposed in an island shape spaced apart from the data line DL and the driving current ling VDD by a predetermined distance and overlapping the semiconductor layers SA and DA.

A buffer layer BUF is deposited on entire surface of the substrate 110 as covering the data line DL and the driving current line VDD. On the buffer layer BUF, the semiconductor layer SA of the switching thin film transistor ST and the semiconductor layer DA of the driving thin film transistor DT are formed. The switching thin film transistor ST and the driving thin film transistor DT are formed on the buffer layer BUF. It is preferable, but not required, that the channel areas in the semiconductor layers SA and DA overlap with the light shielding layer LS.

A gate insulating layer GI is deposited on the substrate 110 as covering the semiconductor layers SA and DA. A gate electrode SG overlapping with the semiconductor layer SA of the switching thin film transistor ST and the gate electrode DG overlapping with the semiconductor layer DA of the driving thin film transistor DT are formed on the gate insulating layer GI. In addition, at both sides of the gate electrode SG of the switching thin film transistor ST, a source electrode SS contacting one side of the semiconductor layer SA while being spaced apart from the gate electrode SG, and a drain electrode SD contacting the other side of the semiconductor layer SA are formed. Further, at both sides of the gate electrode DG of the driving thin film transistor DT, a source electrode DS contacting one side of the semiconductor layer DA while being spaced apart from the gate electrode DG, and a drain electrode DD contacting the other side of the semiconductor layer DA are formed.

The gate electrodes SG and DG and the source-drain electrodes SS-SD and DS-DD are formed on the same layer, but are spatially and electrically separated from each other. The source electrode SS of the switching thin film transistor ST can be connected to the data line DL via a contact hole penetrating the gate insulating layer GI. Further, the drain electrode DD of the driving thin film transistor DT can be connected to the driving current line VDD via another contact hole penetrating the gate insulating layer.

A passivation layer PAS is deposited on the substrate 110 as covering the thin film transistors ST and DT. The passivation layer PAS can be made of an inorganic material such as silicon oxide or silicon nitride.

The light emitting element layer 330 is formed on the driving element layer 220. The light emitting element layer 330 can include a planarization layer PL and a light emitting diode OLE. The surface of the substrate 110 on which the thin film transistors ST and DT are formed is not uniform or even, so the planarization layer PL is a thin film for flattening the uneven surface condition. To make the height difference being even, the planarization layer PL can be formed of an organic material. A pixel contact hole PH exposing a part of the source electrode DS of the driving thin film transistor DT is formed in the passivation layer PAS and the planarization layer PL.

The anode electrode ANO is formed on the top surface of the planarization layer PL. The anode electrode ANO connects to the source electrode DS of the driving thin film transistor DT via the pixel contact hole PH. The anode electrode ANO can have different structure and configuring elements according to the emission type of the light emitting diode OLE. For example, in the case of a bottom emission type that provides lights in the direction of the substrate 110, it can be formed of a transparent conductive material. For another example, in the case of a top emission type that provides lights in the upward direction facing the substrate 110, it can be formed of a metal material having excellent light reflectance. Alternatively, when light is emitted in an upward direction facing the substrate 110, a layer formed of a metal material having excellent light reflectance can be further included below or above the layer formed of a transparent conductive material.

A bank BA is formed on the top surface of the substrate 110 having the anode electrode ANO. The bank BA is preferably an insulating layer made of an inorganic material or an organic material. But embodiments of the present disclosure are not limited thereto. Hereinafter, a case made of an in organic material will be described. The bank BA covers the circumferential areas of the anode electrode ANO, and exposes most of the central area. The central area exposed from the bank BA is defined as an emission area EA, and the area covered by bank BA is defined as a non-emission area NEA.

An emission layer EL is disposed on the anode electrode ANO and bank BA. The emission layer EL can be deposited on entire of the display area AA of the substrate 110 as covering the anode electrode ANO and the bank BA. For an example, the emission layer EL can include at least two emission parts for generating white light. In detail, the emission layer EL can include a first emission part and a second emission part vertically stacked for generating white light by mixing the first light from the first emission part and the second light from the second emission part.

For another example, the emission layer EL can include any one of a blue emission part, a green emission part, and a red emission part for generating light corresponding to a color set in each pixel. Further, the light emitting diode OLE can include a functional layer for improving light emitting efficiency and/or lifetime of the emission layer EL.

A cathode electrode CAT is deposited on the entire surface of the substrate 110 on which the emission layer is formed. The cathode electrode CAT is deposited to make surface contact with the emission layer EL. The cathode electrode CAT is formed over the entire substrate 110 to be commonly connected to the emission layer EL deposited in all pixels. In the case of the top emission type, the cathode electrode CAT can include a transparent conductive material. For example, the cathode electrode CAT can be made of a transparent conductive material such as indium-tin-oxide (ITO) or indium-zinc-oxide (IZO). Alternatively, the cathode electrode CAT can include a thin metal such as aluminum (Al), magnesium (Mg), calcium (Ca), silver (Ag) or an alloy or combination thereof (e.g., aluminum-magnesium alloy (AlMg)). But embodiments of the present disclosure are not limited thereto. The cathode electrode CAT can be formed to have light-transmitting characteristics by forming it with a thin thickness less than 300 Å.

An encapsulation layer 440 is stacked on the light emitting element 220. The encapsulation layer 440 can have a single-layer structure made of an inorganic material, or a multi-layer structure in which several inorganic layers are sequentially stacked. As another example, the encapsulation layer 440 can have a structure in which an inorganic layer, an organic layer and an inorganic layer are continuously stacked. Hereinafter, for convenience of description, the encapsulation layer 440 made of a single inorganic layer will be used for explanation.

A color filter CF is stacked on the encapsulation layer 440. The color filter CF can be disposed in a structure in which one of a red color filter, a green color filter and a blue color filter is assigned to one pixel P. As another example, the color filter CF can be disposed in a structure in which one of a red color filter, a white color filter, a green color filter and a blue color filter is allocated to one pixel P. Hereinafter, for convenience of description, a case in which the color filter CF includes a red color filter, a green color filter and a blue color filter is used for explanation.

First Embodiment

Figure 5:
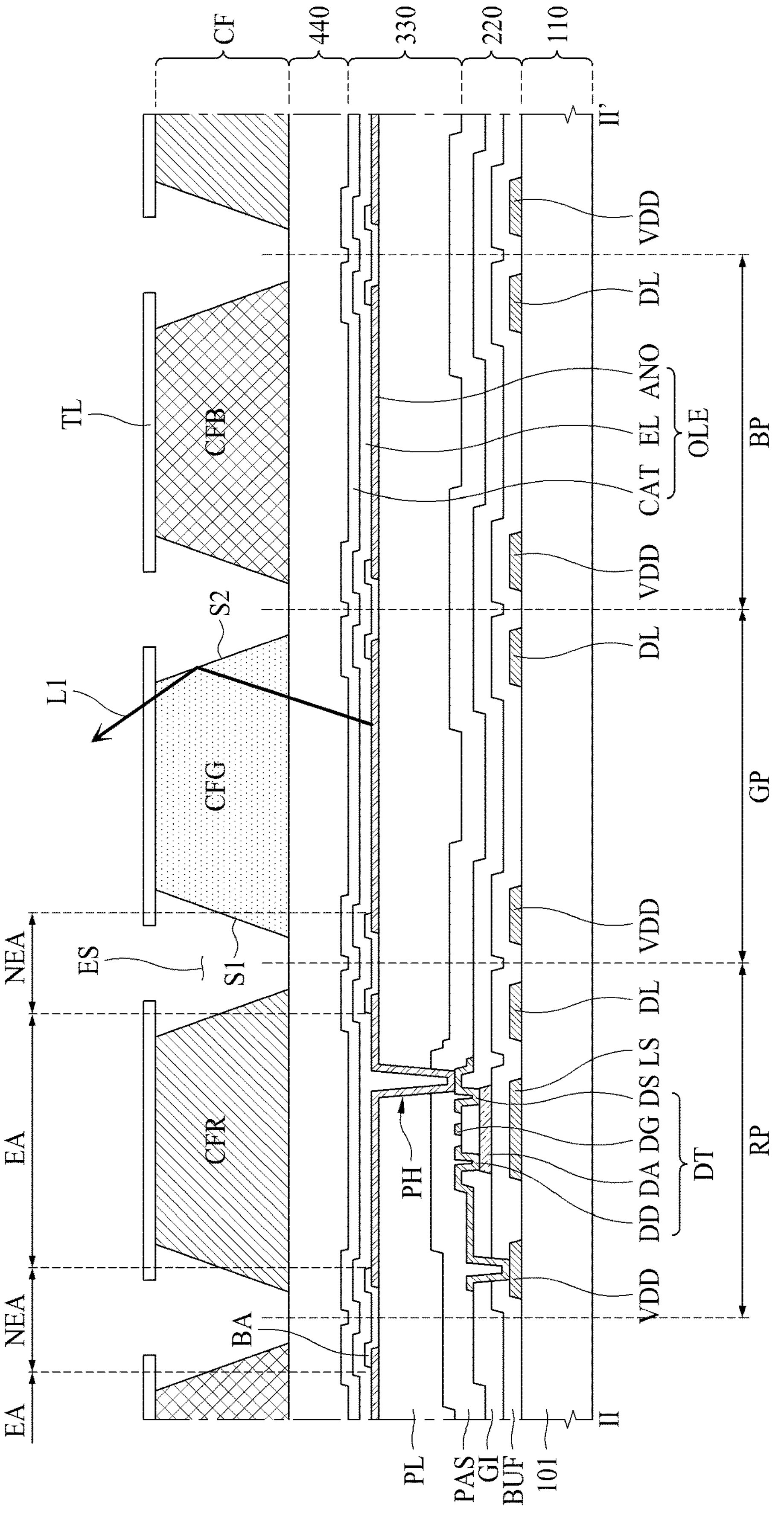
FIG. 5 is an enlarged cross-sectional view, cutting along line II-II' of FIG. 3, for illustrating a structure of three pixels sequentially arrayed in a light emitting display device according to a first embodiment of the present disclosure.

Hereinafter, referring to FIG. 5, a first embodiment of the present disclosure will be described. Particularly, FIG. 5 is an enlarged cross-sectional view, cutting along line II-II' of FIG. 3, for illustrating a structure of three pixels sequentially arrayed in a light emitting display device according to a first embodiment of the present disclosure. In FIG. 5, the description for the elements below the encapsulation layer 440 is the same as those described in FIG. 4, so the same description will not be duplicated or may be provided briefly.

Referring to FIG. 5, a color filter CF is disposed on the encapsulation layer 440. The color filter CF can include a red color filter CFR, a green color filter CFG and a blue color filter CFB. The red color filter CFR is disposed on the red pixel RP, the green color filter CFG is disposed on the green pixel GP, and the blue color filter CFB is disposed on the blue pixel BP.

Each of the red color filter CFR, green color filter CFG and blue color filter CFB can be patterned in a trapezoidal shape. However, embodiments of the present disclosure are not limited thereto; the color filters can have a semicircular shape or semi-elliptical shape. A space or a gap, such as an empty space ES can be formed or located between the red color filter CFR, the green color filter CFG and the blue color filter CFB to be spaced apart at an interval, such as regular intervals. An air-layer can be filled or located in the empty space ES, but embodiments of the present disclosure as not limited thereto, and other materials can be filled in the space ES, or the empty space ES can remain empty. But embodiments of the present disclosure are not limited thereto. For example, the separation between adjacent color filters CF, such as the red color filter CFR, green color filter CFG and blue color filter CFB can include various combinations of the filler, the air layer, other materials, elements of the color filter, for example.

A transparent layer TL can be stacked on upper surface of each of the red color filter CFR, the green color filter CFG and the blue color filter CFB. It is preferable, but not required, that the transparent layer TL is formed in an island shape for each pixel P, respectively. Accordingly, the transparent layers TL are spaced apart at regular intervals between neighboring pixels P. This interval, i.e., the gap, is connected to the empty space ES, and the upper surface of the encapsulation layer 440 between the pixels P is exposed.

For example, when the color filter CF has a regular trapezoidal shape, it includes a lower surface, an upper surface and two side surfaces. The lower surface is corresponding to the surface in contact with the encapsulation layer 440. The upper surface is the surface corresponding to the surface contacting the transparent layer TL. Two side surfaces are disposed as connecting the upper surface and the lower surface at two opposite sides, respectively. As shown in FIG. 5, in the cross-sectional structure, the side of the color filter CF can include a left side surface S1 and a right side surface S2. The side surfaces are inclined at a certain angle based on a vertical line with respect to the surface of the encapsulation layer 440. In particular, an acute angle can be formed between the lower surface and the side surface.

The lower surface of the color filter CF can have an area equal to or slightly larger than that of the emission area EA. The upper surface can have a smaller area than the emission area EA. The color filters CF are spaced apart from each other. Therefore, when the area of the lower surface of the color filter CF is too wide, it can overlap with the adjacent color filter CF. In order to prevent this problem, it is preferable, but no required, that the lower surface of the color filter CF has a size of about 110% of the emission area EA, and is spaced apart from neighboring color filters CF by a predetermined distance.

When the upper surface area of the color filter CF is too small than the emission area EA, the amount of light condensed in the vertical direction of the front of the display device is too severely high, the light distribution may not be uniformed, so that the viewing angle can be too narrowed. Therefore, it is preferable, but not required, that the area of the upper surface of the color filter CF can correspond to at least 50% of the emission layer EA.

Due to the structure of the color filter CF and the transparent layer TL having such a structure, light condensing efficiency of light emitted from the emission layer EL of the light emitting diode OLE can be improved. For an example, a light condensing mechanism by the green color filter CFG in the green pixel GP will be described.

As the light path L1 shown in FIG. 5, the light emitted from the emission layer EL of the light emitting diode OLE disposed in the green pixel GP can be transmitted through a green color filter CFG disposed on the encapsulation layer 440. The green color filter CFG can have a regular trapezoidal shape. For example, the inclined left side surface S1 is disposed at the left side and the inclined right side surface S2 is disposed at the right side. The left side surface S1 and the right side surface S2 are in contact with the empty space ES. The green color filter CFG is preferably formed of a high refractive index material. For example, it is preferable, but not required, that the green color filter CFG includes an organic material having a refractive index of 1.7 or higher for green light. But embodiments of the present disclosure are not limited thereto.

Meanwhile, the transparent layer TL preferably has a refractive index greater than the refractive index of the air, and equal to or smaller than refractive index of the color filter CF. But embodiments of the present disclosure are not limited thereto. The transparent layer TL can be formed of a transparent inorganic material having a refractive index higher than that of air, and equal to or lower than the refractive index of the color filter CF. For example, the transparent layer TL preferably has a refractive index of 1.4 to 1.7. Most preferably, the refractive index of the transparent layer TL can be 1.4. As a result, light concentrated in an upper vertical direction by the color filter CF which has a high refractive material can be partially diffused while passing through the transparent layer TL having a lower refractive index than the color filter CF. But embodiments of the present disclosure are not limited thereto. In addition, after passing through the transparent layer TL, the light can be further diffused while being incident to the air (layer).

In other words, as light is condensed in a vertical direction in front of the display device by the color filter CF having a high refractive index, color mixing and light leakage do not occur, so that the light efficiency can be enhanced. After that, when the light proceeds as it is, the luminance in the front vertical direction can be excessively high, or the viewing angle can be narrowed. However, since the low refractive layers are sequentially disposed outside the color filter CF, which has a high refractive material, the light is diffused with wider angle based on the frontal vertical direction, so that the viewing angle can be widened and the luminance can be evenly distributed within the widened viewing angle.

According to the structure of the color filter CF, at the left side surface S1 and the right side surface S2, the high refractive index layer and the air layer are in contact with each other. Since the air layer has a refractive index of 1.0, the low refractive material (i.e., air) surrounds the outside of the high refractive material (i.e., color filter). Green light traveling from high refractive index material to the low refractive index material can be reflected at the interface (left side surface S1 and right side surface S2) and then the green light travels upward. In particular, in the angular range in with total internal reflection is satisfied, most of the green light can be focused toward the front of the green pixel GP. As a result, the light efficiency of the green light can be increased or enhanced. Further, leakage of green light into the red pixel RP disposed on the left side and the blue pixel BP disposed on the right side can be suppressed or minimized. Consequently, a problem of light leakage or color mixing between neighboring pixels can be prevented.

In addition, since the color filter CF can be used to form a shape such as a micro-lens, a better effect can be obtained than when a separated micro-lens is formed on the color filter CF. For an example, since an additional process for forming a micro-lens layer is not required, the manufacturing process time can be shortened and the manufacturing cost can be reduced. When an alignment error between the micro-lens layer and the color filter occurs, the effect of improving light efficiency can be deteriorated. However, since the light emitting display device according to the present disclosure does not have the separately manufactured micro-lens, there is no problem of deteriorated light efficiency due to the alignment error.

Second Embodiment

Figure 6:
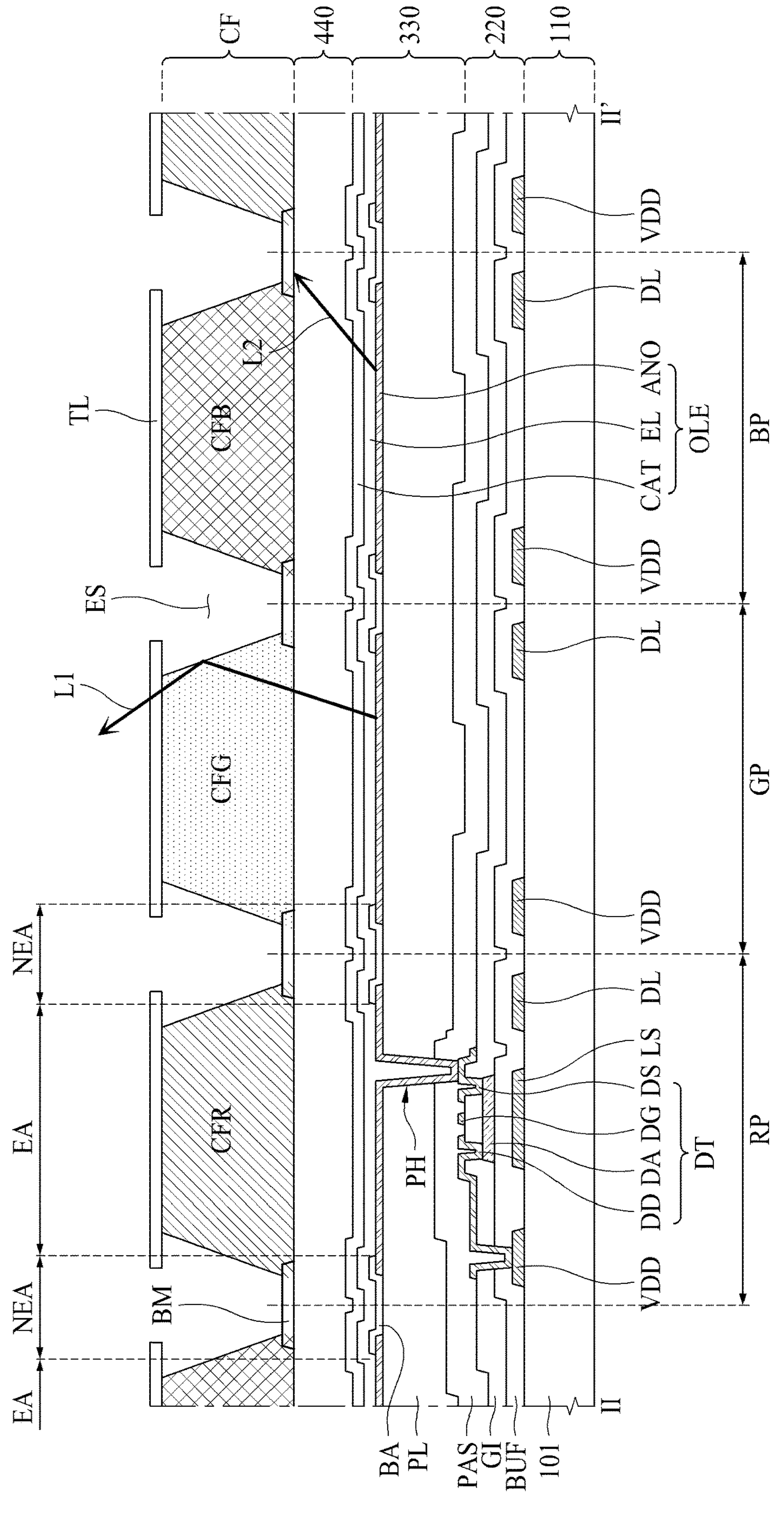
FIG. 6 is an enlarged cross-sectional view, cutting along line II-II' of FIG. 3, for illustrating a structure of three pixels sequentially arrayed in a light emitting display device according to a second embodiment of the present disclosure.

Hereinafter, referring to FIG. 6, a light emitting display device according to a second embodiment of the present disclosure will be explained. FIG. 6 is an enlarged cross-sectional view, cutting along line II-II' of FIG. 3, for illustrating a structure of three pixels sequentially arrayed in a light emitting display device according to a second embodiment of the present disclosure. In FIG. 6, the description for the elements below the encapsulation layer 440 is the same as those described in FIG. 4, so the same description will not be duplicated.

Referring to FIG. 6, the light emitting display device according to the second embodiment of the present disclosure has an almost same structure to the light emitting display device according to the first embodiment of the present disclosure. The difference is that the second embodiment is characterized by further including a black matrix BM in the structure of the first embodiment.

A black matrix BM is formed on the encapsulation layer 440. In particular, the black matrix BM is disposed between two neighboring pixels P. In detail, the black matrix BM is disposed between the red pixel RP and the green pixel GP, between the green pixel GP and the blue pixel BP, and between the blue pixel BP and the red pixel RP, respectively.

The black matrix BM can be disposed to be partially overlapped the lower edge side of the color filter CF. Both edge sides of the black matrix BM can overlap two adjacent color filters CF. In detail, one end of the black matrix BM disposed between the red pixel RP and the green pixel GP can overlap the red color filter CFR, and the other end can overlap the green color filter CFG.

Due to the arrangement of the black matrix BM, it is more reliable to prevent light leakage or color mixing between neighboring two pixels P. Like the light path L2 shown in FIG. 6, leaked light is blocked by the black matrix BM and does not enter into neighboring pixels P. The black matrix BM is preferably formed of an inorganic material or an organic material having low light reflectance and high light absorption properties. For example, the black matrix BM can be formed of a carbon material having excellent light absorptivity. But embodiments of the present disclosure are not limited thereto. Alternatively, the black matrix BM can be formed of a metal material such as a molybdenum-titanium alloy having low light reflectance.

The light emitting display device according to the second embodiment can improve light condensing efficiency in the front direction of the display device, and can prevent light leakage and color mixing problems. In addition, since higher luminance can be obtained with the same power consumption, low power driving can be acquired.

Third Embodiment

Figure 7A:
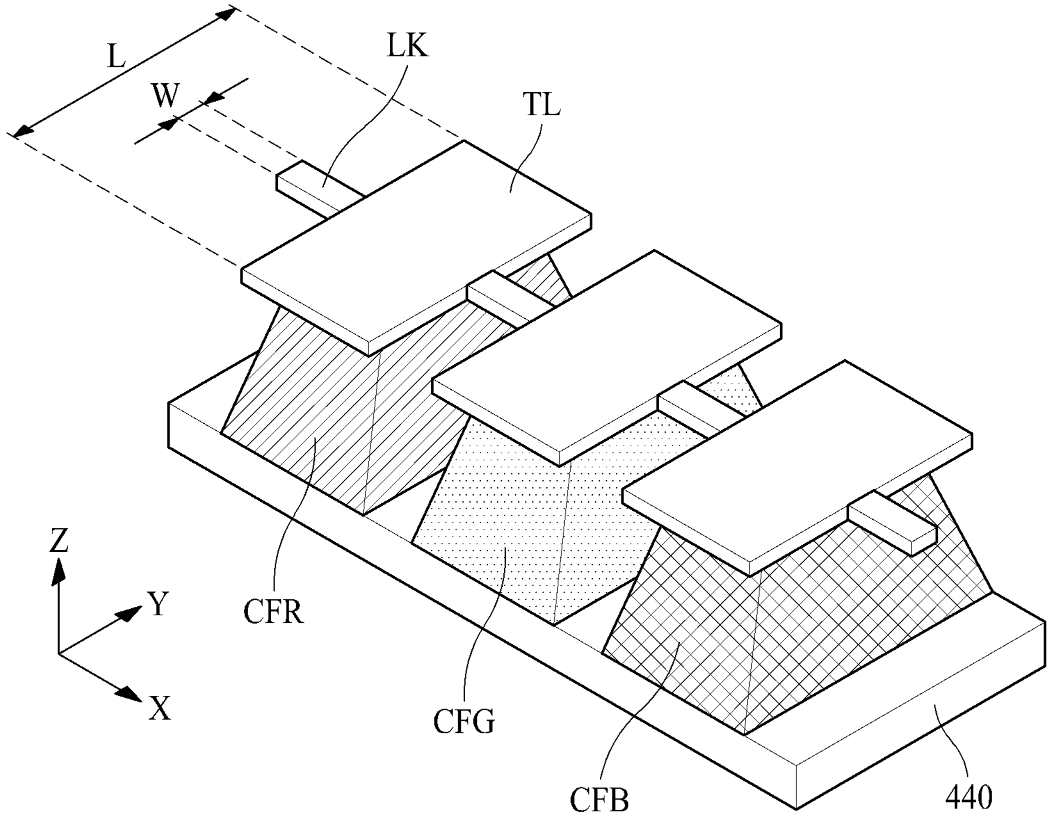
FIGS. 7A and 7B are enlarged perspective views illustrating a structure of three pixels consecutively arrayed in the light emitting display device according to a third embodiment of the present disclosure.
Figure 7B:
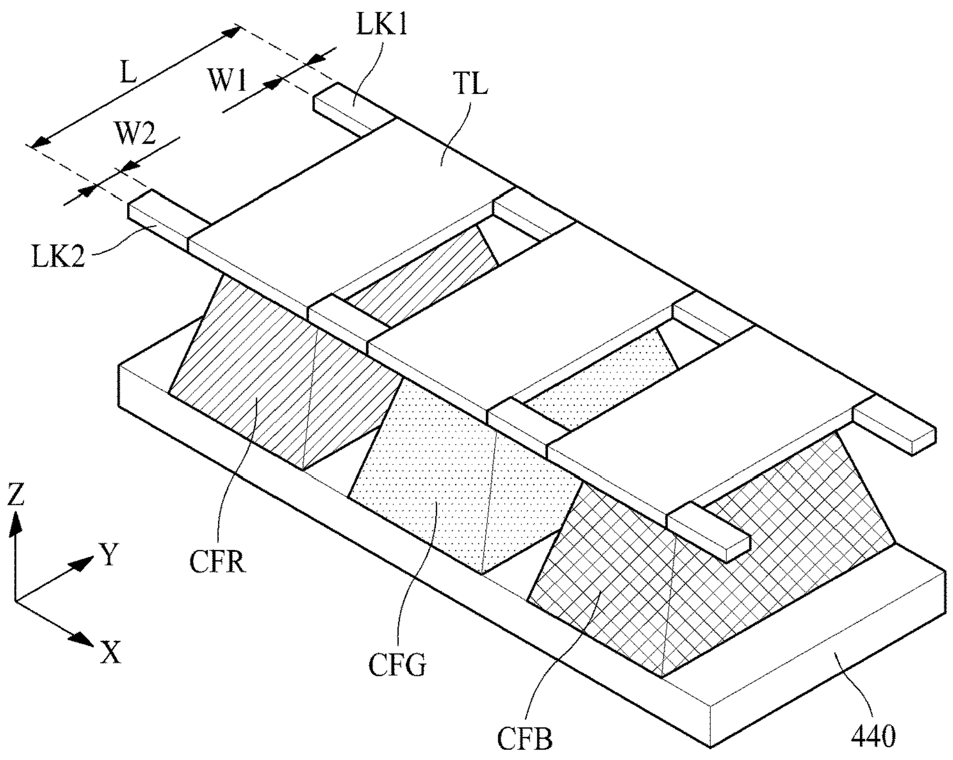

Hereinafter, referring to FIGS. 7A and 7B, a third embodiment of the present disclosure will be described. Particularly, FIGS. 7A and 7B are enlarged perspective views illustrating a structure of three pixels consecutively arrayed in the light emitting display device according to a third embodiment of the present disclosure. FIGS. 7A and 7B are perspective views in order to clearly understand structural characteristics and arrangement relationships of elements. These perspective views are corresponding to the cross-sectional view taken along line II-II in FIG. 3. In FIGS. 7A and 7B, the description for the elements below the encapsulation layer 440 is the same as those described in FIG. 4, so the same description will not be duplicated or may be briefly provided.

Referring to 7A and 7B, the light emitting display device according to the third embodiment of the present disclosure has an almost same structure to the light emitting display device according to the first embodiment of the present disclosure. The difference is that the third embodiment is characterized by further including a link portion LK connecting (or bridging) the transparent layer TL between the color filters CF. In detail, the link portion LK can be disposed as connecting the transparent layers TL isolate disposed on the upper surface of the red color filter CFR, the green color filter CFG and the blue color filter CFB.

In FIG. 7A, a structure in which the link portion LK is disposed to connect the central part of the transparent layer TL is illustrated. In particular, in FIG. 7A, the link portion LK has a structure extending in the X-axis direction to connect the transparent layer TL disposed along the X-axis direction of the display device. However, embodiments of the present disclosure are not limited thereto. It can have a structure extending to the Y-axis direction to connect the transparent layers TL disposed along the Y-axis direction of the display device.

In the structure shown in FIG. 7A, it is preferable, but not required, that the width of the link portion LK has a value such that the area of the opening region due to the predetermined interval, in which the transparent layers TL are spaced between neighboring pixels P, is not excessively reduced. For example, the width W of the link portion LK is preferably 20% to 30% of the longitudinal length L of the transparent layer TL. But embodiments of the present disclosure are not limited thereto.

FIG. 7B shows a structure in which the link portion LK is disposed to connect both side edges of the transparent layer TL. In particular, according to FIG. 7B, the link portion LK has a structure extending to the X-axis direction to connect both side edges of the transparent layers TL disposed along the X-axis direction of the display device. However, embodiments of the present disclosure are not limited thereto. The link portion LK can have a structure extending in the Y-axis direction to connect both side edges of the transparent layers TL disposed along the Y-axis direction of the display device.

In the structure shown in FIG. 7B, it is preferable, but not required, that the total width of the link portions LK has a value such that the area of the opening region due to the predetermined interval, in which the transparent layers TL are spaced between neighboring pixels P, is not excessively reduced. For example, the sum of the first width W1 and the second width W2 of the link portions LK is preferably 20% to 30% of the longitudinal length L of the transparent layer TL. But embodiments of the present disclosure are not limited thereto.

The light emitting display device according to the third embodiment can improve light condensing efficiency in the front direction of the display device, and can prevent light leakage and color mixing problems. By further including the link portion, stability and durability of the display device can be structurally ensured. In addition, since higher luminance can be obtained with the same power consumption, low power driving can be acquired.

Fourth Embodiment

Figure 8A:
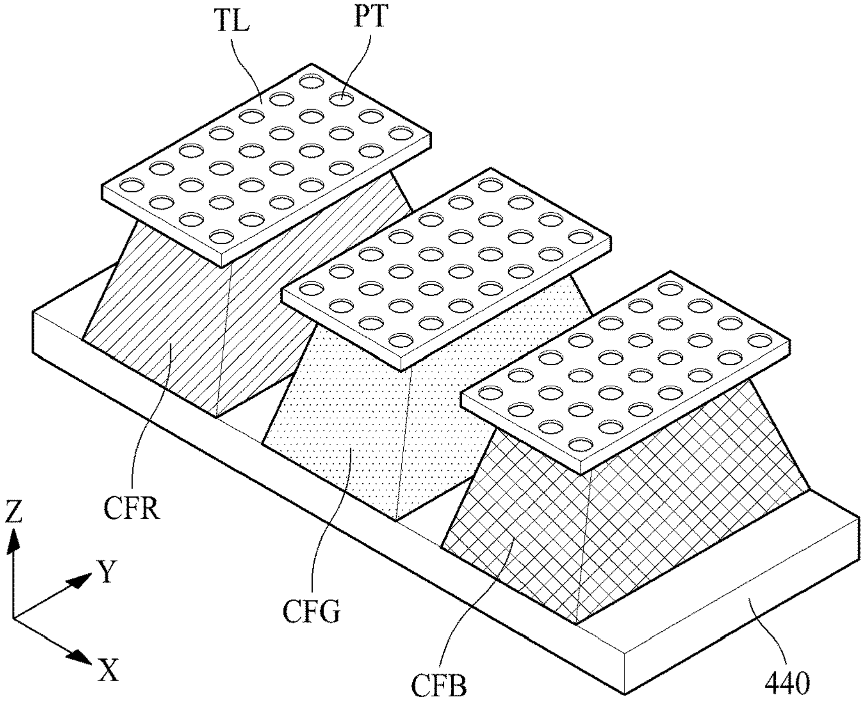
FIGS. 8A to 8C are enlarged perspective views illustrating a structure of three pixels consecutively arrayed in the light emitting display device according to a fourth embodiment of the present disclosure.
Figure 8B:
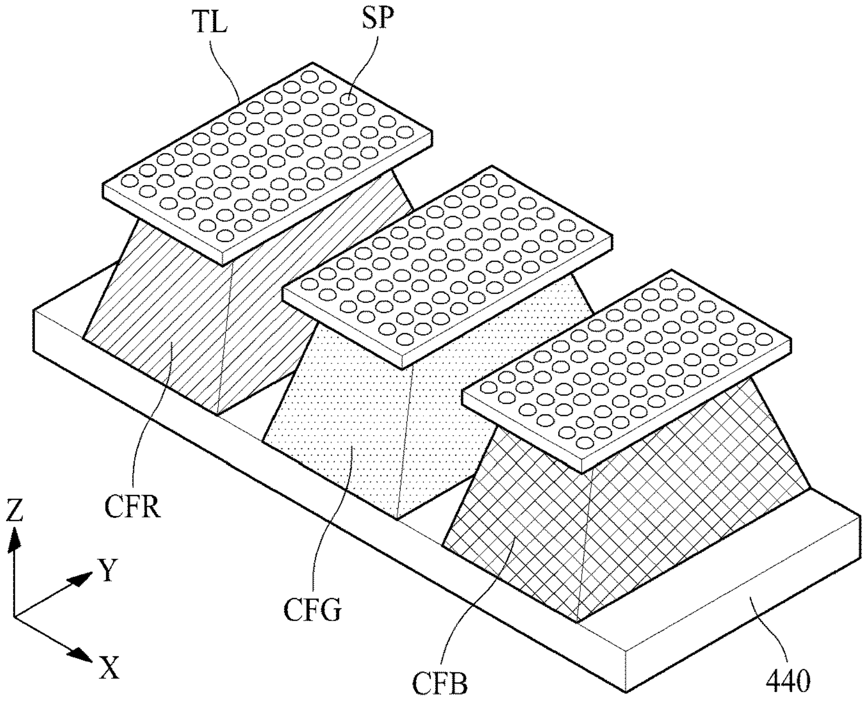
Figure 8C:
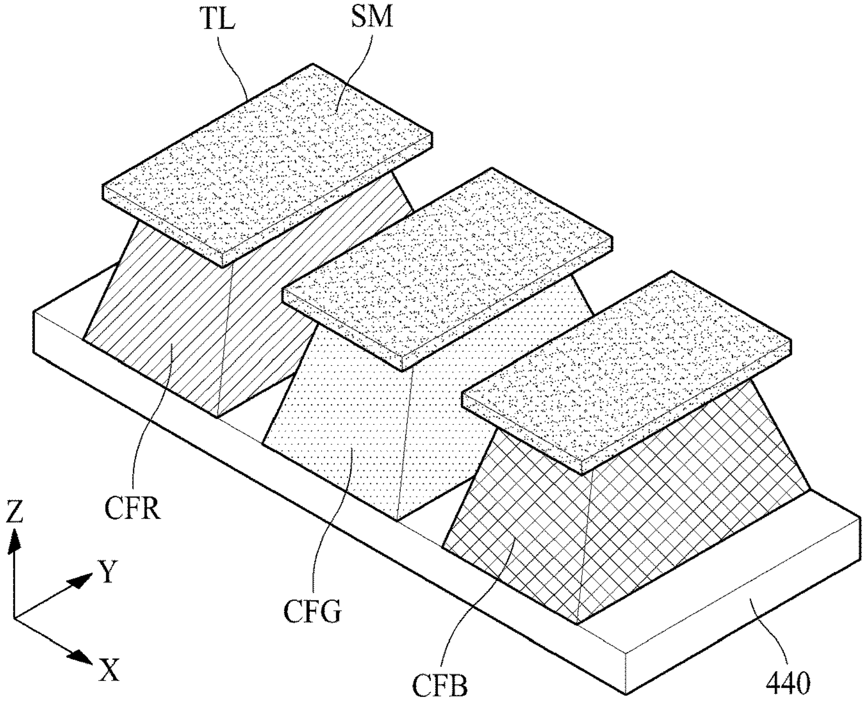

Hereinafter, referring to FIGS. 8A to 8C, a fourth embodiment of the present disclosure will be described. FIGS. 8A to 8C are enlarged perspective views illustrating a structure of three pixels consecutively arrayed in the light emitting display device according to a fourth embodiment of the present disclosure. Particularly, FIGS. 8A to 8C are perspective views in order to clearly understand structural characteristics and arrangement relationships of elements. These perspective views are corresponding to the cross-sectional view taken along line II-II in FIG. 3. In FIGS. 8A to 8C, the description for the elements below the encapsulation layer 440 is the same as those described in FIG. 4, so the same description will not be duplicated or may be briefly provided.

Referring to 8A to 8C, the light emitting display device according to the fourth embodiment of the present disclosure has an almost same structure to the light emitting display device according to the first embodiment of the present disclosure. The difference is that the fourth embodiment is characterized by further including a plurality of scattering patterns in the transparent layer TL.

Referring to FIG. 8A, a plurality of light emission patterns PT is formed on the upper surface of the transparent layer TL. For example, the light emission pattern PT can be formed as a grating pattern or a micro-lens pattern. In the description of the first embodiment, it has been explained that it is preferable, but not required, to diffuse the light condensed by the color filter CF in wider directions based on the front vertical direction when the light is finally emitted to the outside. To do so, it is also explained that the refractive index of the transparent layer TL is preferably lower than that of the color filter CF and higher than that of air (layer). But embodiments of the present disclosure are not limited thereto. In the fourth embodiment, a light emission pattern PT is further provided above the transparent layer TL in order to more enhance the diffusivity of the finally emitted light based on the front vertical direction.

Referring to FIG. 8B, light scattering particles SP are distributed on the upper surface of the transparent layer TL. The light scattering particles SP are also an element for increasing the viewing angle and evenly distributing light by diffusing the finally emitted light in wider directions based on the front vertical direction, similar to the light emission pattern PT described in FIG. 8A. For example, the light scattering particles SP can have a shape similar to a very small spherical ball or lens.

Referring to FIG. 8C, the transparent layer TL can include a light scattering material SM therein. The light scattering material SM is also an element for increasing the viewing angle and evenly distributing light by diffusing the finally emitted light in wider directions based on the front vertical direction, similar to the light emission pattern PT described in FIG. 8A and the light scattering particles SP described in FIG. 8B.

The light emitting display device according to the fourth embodiment can improve light condensing efficiency in the front direction of the display device, and can prevent light leakage and color mixing problems. A wide viewing angle can be acquired and luminance distribution can be uniformly ensured by evenly diffusing the light condensed in the front direction to wider directions from the front direction while being finally emitted from the display device. In addition, since higher luminance can be obtained with the same power consumption, low power driving can be acquired.

Fifth Embodiment

Figure 9:
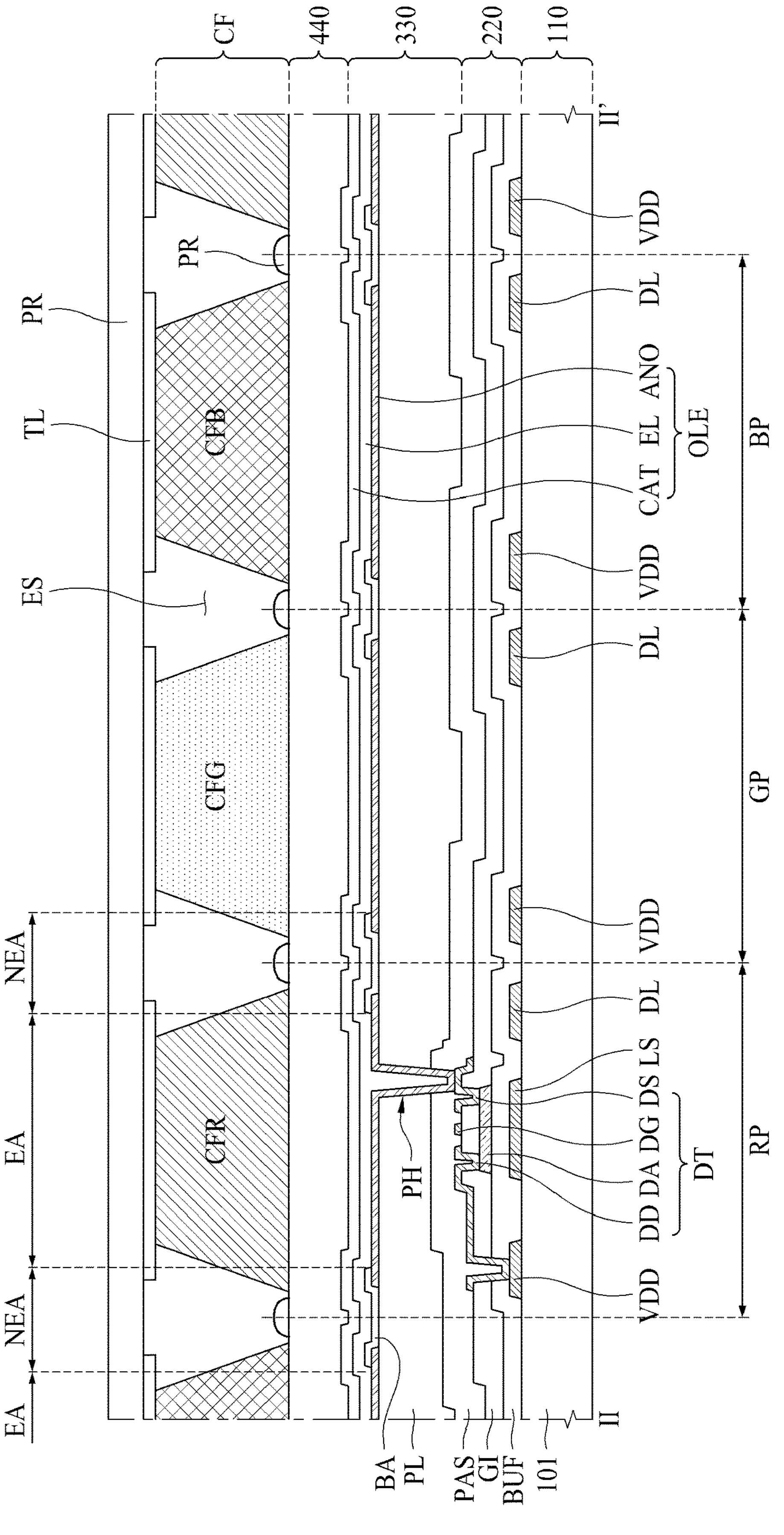
FIG. 9 is an enlarged cross-sectional view, cutting along line II-II' of FIG. 3, for illustrating a structure of three pixels sequentially arrayed in a light emitting display device according to a fifth embodiment of the present disclosure.

Hereinafter, referring to FIG. 9, a light emitting display device according to a fifth embodiment of the present disclosure will be explained. Particularly, FIG. 9 is an enlarged cross-sectional view, cutting along line II-II' of FIG. 3, for illustrating a structure of three pixels sequentially arrayed in a light emitting display device according to a fifth embodiment of the present disclosure. In FIG. 9, the description for the elements below the encapsulation layer 440 is the same as those described in FIG. 4, so the same description will not be duplicated or may be briefly provided.

Referring to FIG. 9, the light emitting display device according to the fifth embodiment of the present disclosure has an almost same structure to the light emitting display device according to the first embodiment of the present disclosure. The difference is that the fifth embodiment is characterized by further including an upper protection layer PR in the structure of the first embodiment.

In detail, an upper protection layer PR is further deposited on the upper surface of the transparent layer TL. It is preferable, but not required, that the upper protection layer PR is made of a transparent material. In addition, it is preferable, but not required, that the upper protection layer PR has a refractive index equal to or lower than that of the transparent layer TL and higher than that of air. For example, the upper protection layer PR can be formed of a transparent material having a refractive index of 1.2 to 1.4.

The upper protection layer PR is preferably formed as one thin sheet layer connected over the entire surface of the substrate 110 in order to prevent damage on both wing parts of the transparent layer TL formed independently for each pixel P. The wing parts means a portion of the transparent layer TL extended from the color filter CF. In the process of depositing the upper protection layer PR, a portion is deposited on the upper surface of the encapsulation layer 440 exposed between the color filters CF through the gap between the neighboring two transparent layers TL. When the gap between the transparent layers TL is too wide, the upper protection layer PR fills the empty space ES, so that the empty space ES between the color filter CF may not be ensured. When the empty space ES is not ensured, the light cannot be condensed to the front direction. Therefore, in order to ensure the empty space ES between the color filters CF, it is necessary to adjust the spacing between the transparent layers TL in consideration of the deposition characteristics of the upper protection layer PR.

The light emitting display device according to the fifth embodiment can improve light condensing efficiency in the front direction of the display device, and can prevent light leakage and color mixing problems. By further including the upper protection layer PR, stability and durability of the display device can be structurally ensured. In addition, since higher luminance can be obtained with the same power consumption, low power driving can be acquired.

Sixth Embodiment

Figure 10:
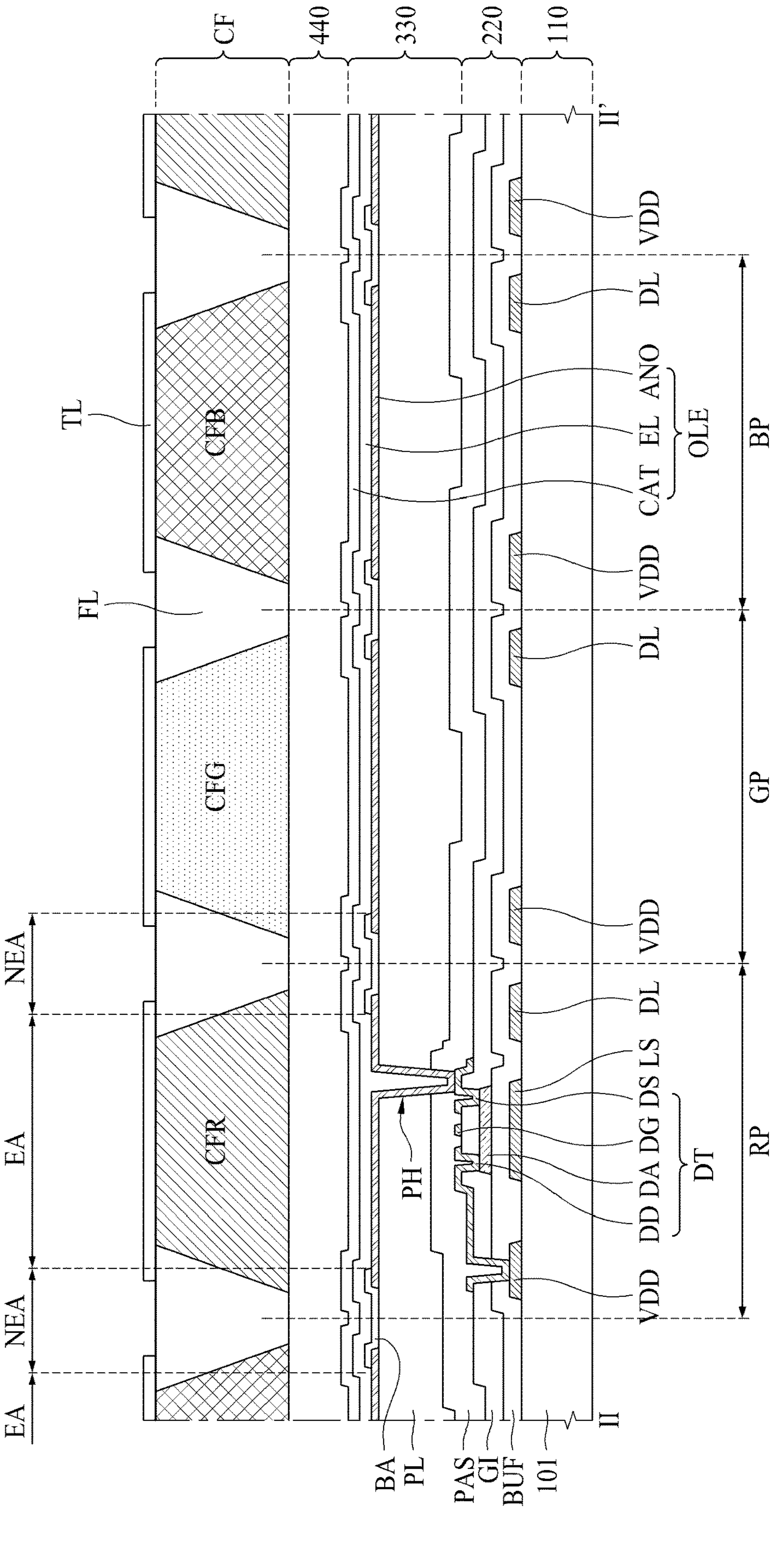
FIG. 10 is an enlarged cross-sectional view, cutting along line II-II' of FIG. 3, for illustrating a structure of three pixels sequentially arrayed in a light emitting display device according to a sixth embodiment of the present disclosure.

Hereinafter, referring to FIG. 10, alight emitting display device according to a sixth embodiment of the present disclosure will be explained. Particularly, FIG. 10 is an enlarged cross-sectional view, cutting along line II-II' of FIG. 3, for illustrating a structure of three pixels sequentially arrayed in a light emitting display device according to a sixth embodiment of the present disclosure. In FIG. 10, the description for the elements below the encapsulation layer 440 is the same as those described in FIG. 4, so the same description will not be duplicated or may be briefly provided.

Referring to FIG. 10, the light emitting display device according to the sixth embodiment of the present disclosure has an almost same structure to the light emitting display device according to the first embodiment of the present disclosure. The difference is that the sixth embodiment is characterized by further including a filling layer FL filling the empty space ES in the structure of the first embodiment. The filling layer FL can be an element for preventing damages on the wing parts of the transparent layer TL and for enhancing the structural stability of the color filters CF, for example, when the transparent layer TL has a constant thickness that is relatively thin at both the wing parts and a main part. The main part of the transparent layer TL refers to that which contacts the color filter CF.

The filling layer FL is a material that fills the empty space ES between the color filters CF having a high refractive index, so it is preferable, but not required, that the filling layer FL has a lower refractive index than the color filters CF and the transparent layer TL. For example, the filling layer FL is preferably formed of a transparent material having a refractive index of 1.0 to 1.2. But embodiments of the present disclosure are not limited thereto. It is desirable that the filling layer FL has excellent fluidity to fill the empty space ES through the gap between the transparent layers TL, and is formed of an organic material that is cured by a photoreaction after filling the empty space ES. However, embodiments of the present disclosure are not limited thereto. For another example, the filling layer FL can be formed of an organic material having excellent light absorption and being opaque.

The light emitting display device according to the sixth embodiment can improve light condensing efficiency in the front direction of the display device, and can prevent light leakage and color mixing problems. By further including the filling layer FL, stability and durability of the display device can be structurally ensured. In addition, since higher luminance can be obtained with the same power consumption, low power driving can be acquired.

Seventh Embodiment

Figure 11:
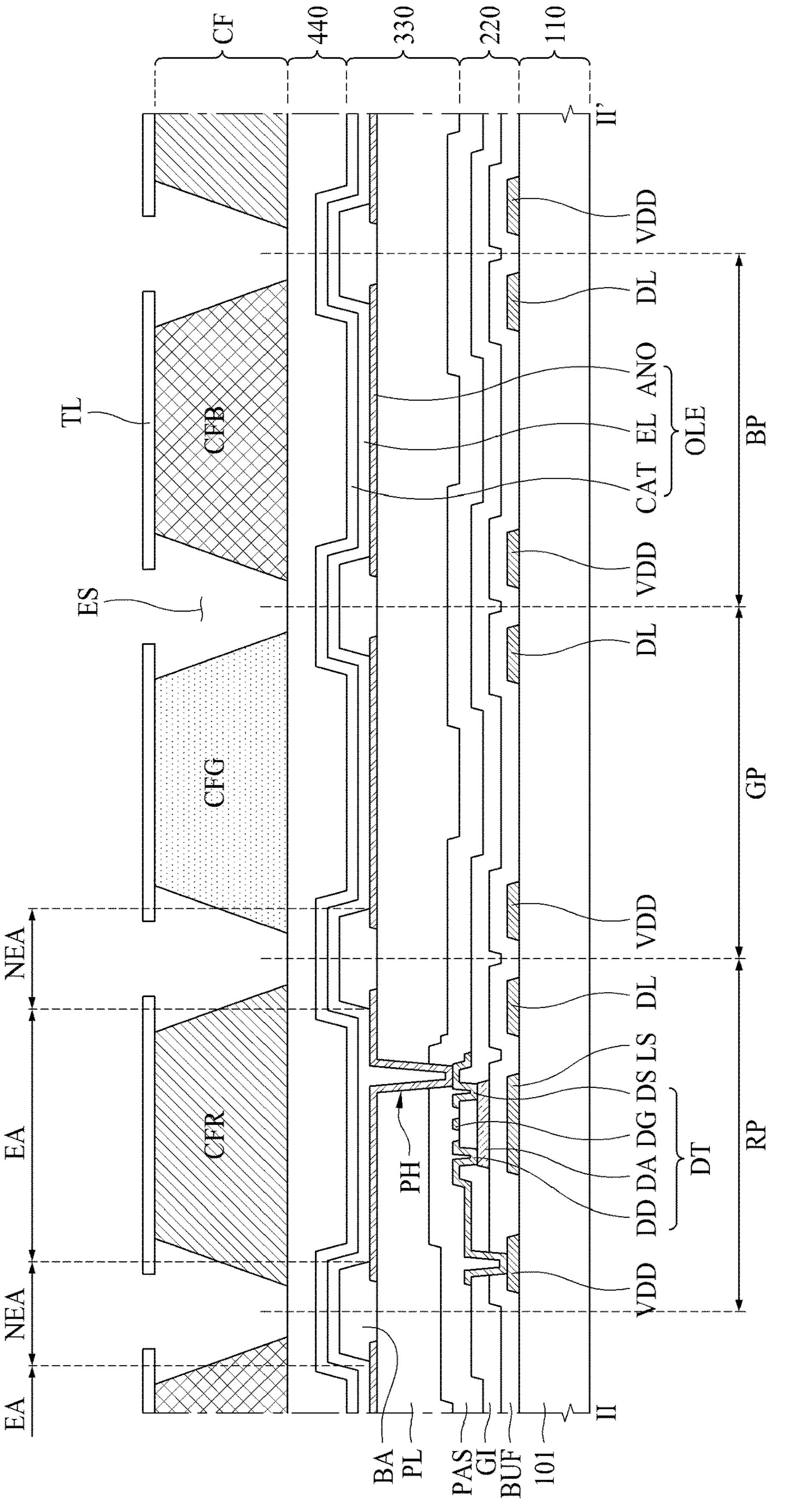
FIG. 11 is an enlarged cross-sectional view, cutting along line II-II' of FIG. 3, for illustrating a structure of three pixels sequentially arrayed in a light emitting display device according to a seventh embodiment of the present disclosure.

Hereinafter, referring to FIG. 11, a light emitting display device according to a seventh embodiment of the present disclosure will be explained. Particularly, FIG. 11 is an enlarged cross-sectional view, cutting along line II-II' of FIG. 3, for illustrating a structure of three pixels sequentially arrayed in a light emitting display device according to a seventh embodiment of the present disclosure. In FIG. 11, excepting required cases, the description for the elements below the encapsulation layer 440 is the same as those described in FIG. 4, so the same description will not be duplicated or may be briefly provided.

Referring to FIG. 11, the light emitting display device according to the seventh embodiment of the present disclosure has an almost same structure to the light emitting display device according to the first embodiment of the present disclosure. The difference is that the seventh embodiment has a different feature in the structure of the light emitting element layer 220 from that of the first embodiment.

In detail, for the light emitting display device according to the seventh embodiment, the bank BA has a trapezoidal shape with an inclined side surface. The bank BA according to the seventh embodiment can have much higher height than the bank BA according to the first embodiment, and can have a trapezoidal cross-sectional shape with an inclined side having an inclined angle of between 30 degrees and 50 degrees.

An emission angle of light provided from the emission layer EL can be controlled by the structure of the bank BA. For example, viewing angle of the light emitted from the emission layer EL of the green pixel GP can be controlled by the shape of the bank BA. Accordingly, it is possible to more effectively prevent the green light from intruding into areas of other neighboring pixels P.

In this case, even though the black matrix BM is not prepared on the upper surface of the encapsulation layer 440 further included in the second embodiment, light leakage or color mixing between neighboring pixels P can be prevented. The bank BA can be formed of a black organic material having excellent light absorption property like the black matrix BM.

The light emitting display device according to the seventh embodiment can improve light condensing efficiency in the front direction of the display device, and can prevent light leakage and color mixing problems. In addition, since higher luminance can be obtained with the same power consumption, low power driving can be acquired.

Eighth Embodiment

Hereinafter, referring to FIG. 12, a light emitting display device according to an eighth embodiment of the present disclosure will be explained. Particularly, FIG. 12 is an enlarged cross-sectional view, cutting along line II-II' of FIG. 3, for illustrating a structure of three pixels sequentially arrayed in a light emitting display device according to an eighth embodiment of the present disclosure.

Figure 12:
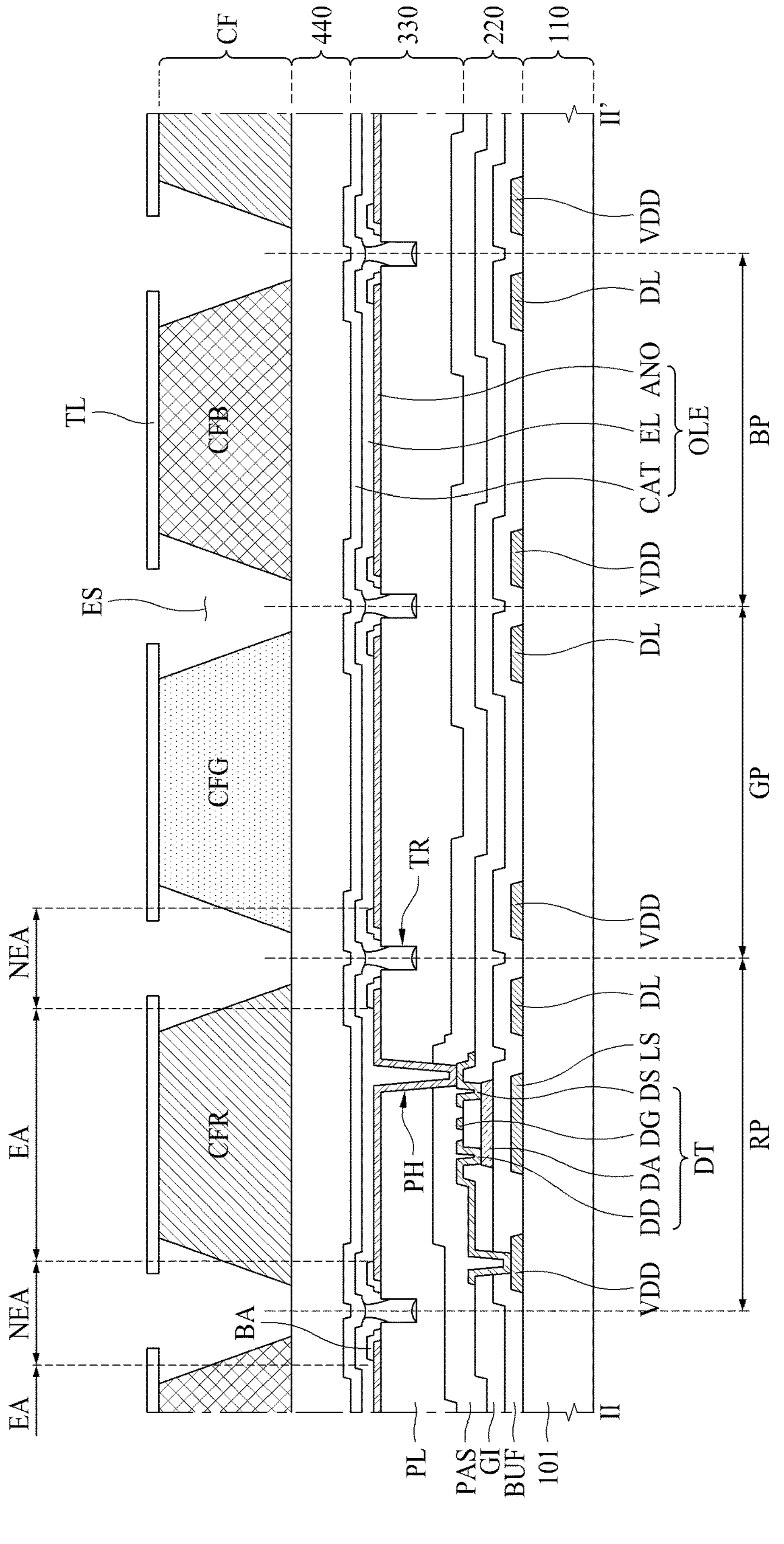
FIG. 12 is an enlarged cross-sectional view, cutting along line II-II' of FIG. 3, for illustrating a structure of three pixels sequentially arrayed in a light emitting display device according to an eighth embodiment of the present disclosure.

Referring to FIG. 12, the light emitting display device according to the eighth embodiment of the present disclosure has an almost same structure to the light emitting display device according to the first embodiment of the present disclosure. The difference is that the eighth embodiment has a different feature in the structure of the light emitting element layer 220 from that of the first embodiment.

The light emitting element layer 220 according to the eighth embodiment can further include a trench TR between pixels P. The trench TR is an element for separating the emission layer EL for each pixel P, wherein the emission layer EL is commonly deposited at the pixels P. When the emission layer EL has a structure connected across all pixels P, a lateral leakage current (LLC) can flow to neighboring pixels through the emission layer EL. In this case, an error can occur in color implementation of a specific pixel P due to the leakage current. This problem can occur more severely in an ultra-high density resolution display device in which a gap between pixels P is narrowed very much. When the emission layer EL has a structure in which a first emission layer, a charge generating layer and a second emission layer are sequentially stacked, the first emission layer and the charge generating layer can be separated for each pixel P by the trench TR. The second emission layer can be connected across all pixels P, or at least some part or the entire second layer can be separated for each pixel P by trench TR.

Even though the emission layer EL is separated for each pixel P by the trench TR, the cathode electrode CAT has one sheet structure connected across all pixels P. Accordingly, even in an ultra-high density resolution structure, the lateral leakage current is not occurred, and thus high quality video image can be provided.

An air layer can be formed in the trench TR, while a part layer or all layers of the emission layer EL is separated for each pixel P by the trench TR. The emission angle of the light provided from the emission layer EL can be controlled by the air layer. For example, an emission angle of the light emitted from the emission layer EL of the green pixel GP can be controlled by the air layer in the trench TR. Accordingly, it is possible to more effectively prevent the green light from penetrating into areas of other neighboring pixels P.

The light emitting display device according to the eighth embodiment can improve light condensing efficiency in the front direction of the display device, and can prevent light leakage and color mixing problems. In addition, since higher luminance can be obtained with the same power consumption, low power driving can be acquired. Further, by including a structure for preventing lateral leakage current in the emission layer, it is possible to provide high-quality for video images with ultra-high density resolution.

Ninth Embodiment

Hereinafter, referring to FIG. 13, alight emitting display device according to a ninth embodiment of the present disclosure will be explained. Particularly, FIG. 13 is an enlarged cross-sectional view, cutting along line II-II' of FIG. 3, for illustrating a structure of three pixels sequentially arrayed in a light emitting display device according to a ninth embodiment of the present disclosure.

Figure 13:
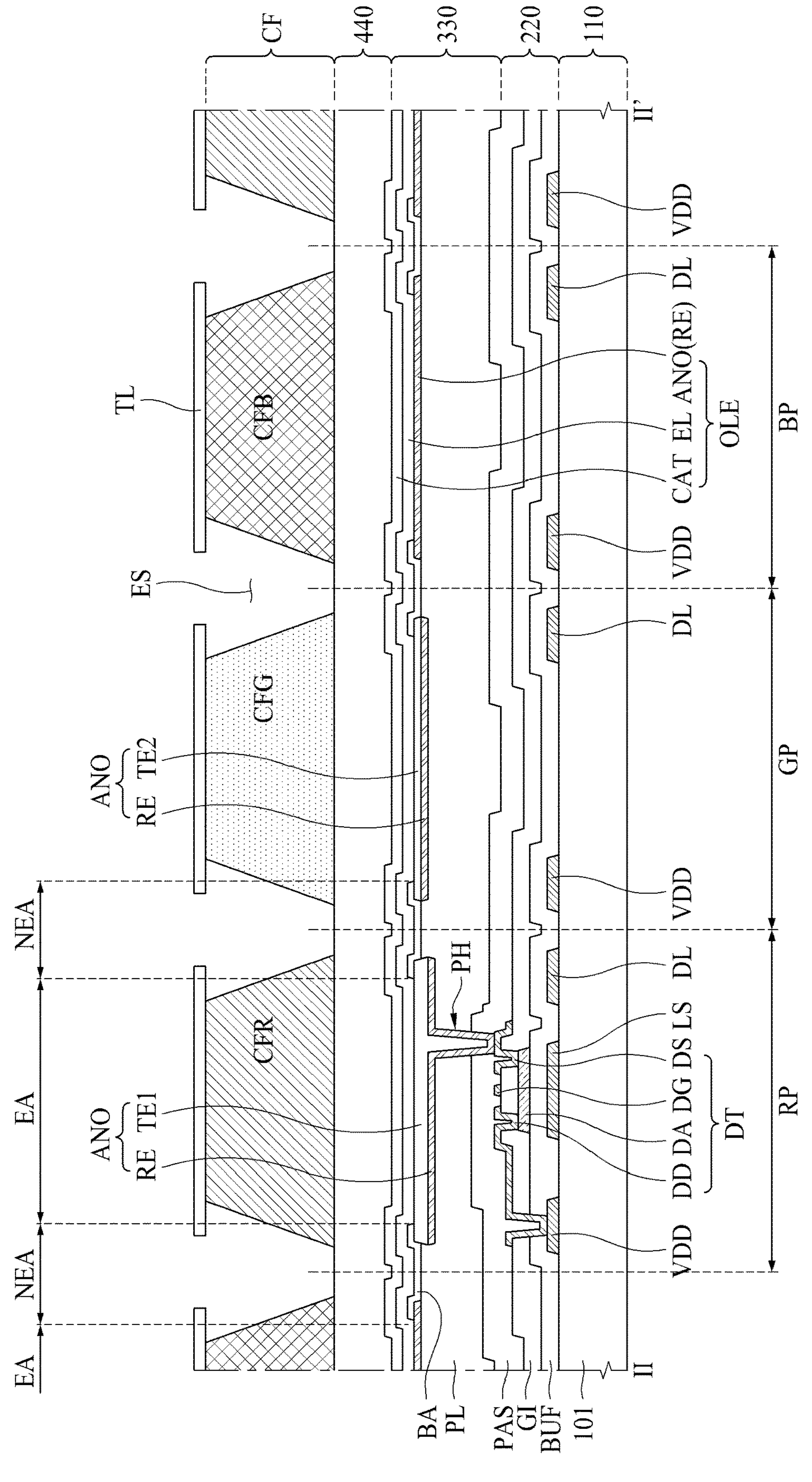
FIG. 13 is an enlarged cross-sectional view, cutting along line II-II' of FIG. 3, for illustrating a structure of three pixels sequentially arrayed in a light emitting display device according to a ninth embodiment of the present disclosure.

Referring to FIG. 13, the light emitting display device according to the ninth embodiment of the present disclosure has an almost same structure to the light emitting display device according to the first embodiment of the present disclosure. The difference is that the ninth embodiment has a different feature in the structure of the light emitting element layer 220 from that of the first embodiment.

In detail, the anode electrode ANO of each pixel P can have different thickness. For example, the anode electrode ANO disposed in the red pixel RP can have a first thickness. The anode electrode ANO disposed in the green pixel GP can have a second thickness different from the first thickness. In addition, the anode electrode ANO disposed in the blue pixel BP can have a third thickness different from the first and second thicknesses.

In more detail, the anode electrode ANO can include a reflective electrode RE and a transparent electrode TE which are sequentially stacked. In order to vary the thickness of the anode electrode ANO, the thickness of the transparent electrode TE can be formed differently, but the reflective electrode RE can be formed with the same thickness. For example, the first transparent electrode TE1 of the red pixel RP can have a first thickness. The second transparent electrode TE2 of the green pixel GP can have a second thickness thinner than the first thickness. The blue pixel BP can include a third transparent electrode TE3 having a third thickness thinner than the second thickness. Otherwise, the blue pixel BP can have no transparent electrode.

The reason why the thickness of the anode electrode ANO is different for each pixel P is to form a different distance between the anode electrode ANO and the cathode electrode CAT for each pixel. This is a structure for providing optimal light emitting efficiency for each pixel P by using a micro cavity effect. By forming the distance between the reflective electrode RE and the cathode electrode CAT to be a multiple of the wavelength of the color light assigned to each pixel P, the light emitting efficiency can be maximized for each color.

The light emitting display device according to the ninth embodiment can improve light condensing efficiency in the front direction of the display device, and can prevent light leakage and color mixing problems. In addition, since higher luminance can be obtained with the same power consumption, low power driving can be acquired. Further, by providing a micro-cavity structure in the light emitting diode OLE, a display device with improved light extraction efficiency for each color pixel can be provided.

Tenth Embodiment

Hereinafter, referring to FIG. 14, a light emitting display device according to a tenth embodiment of the present disclosure will be explained. Particularly, FIG. 14 is an enlarged cross-sectional view, cutting along line II-II' of FIG. 3, for illustrating a structure of three pixels sequentially arrayed in a light emitting display device according to a tenth embodiment of the present disclosure.

Figure 14:
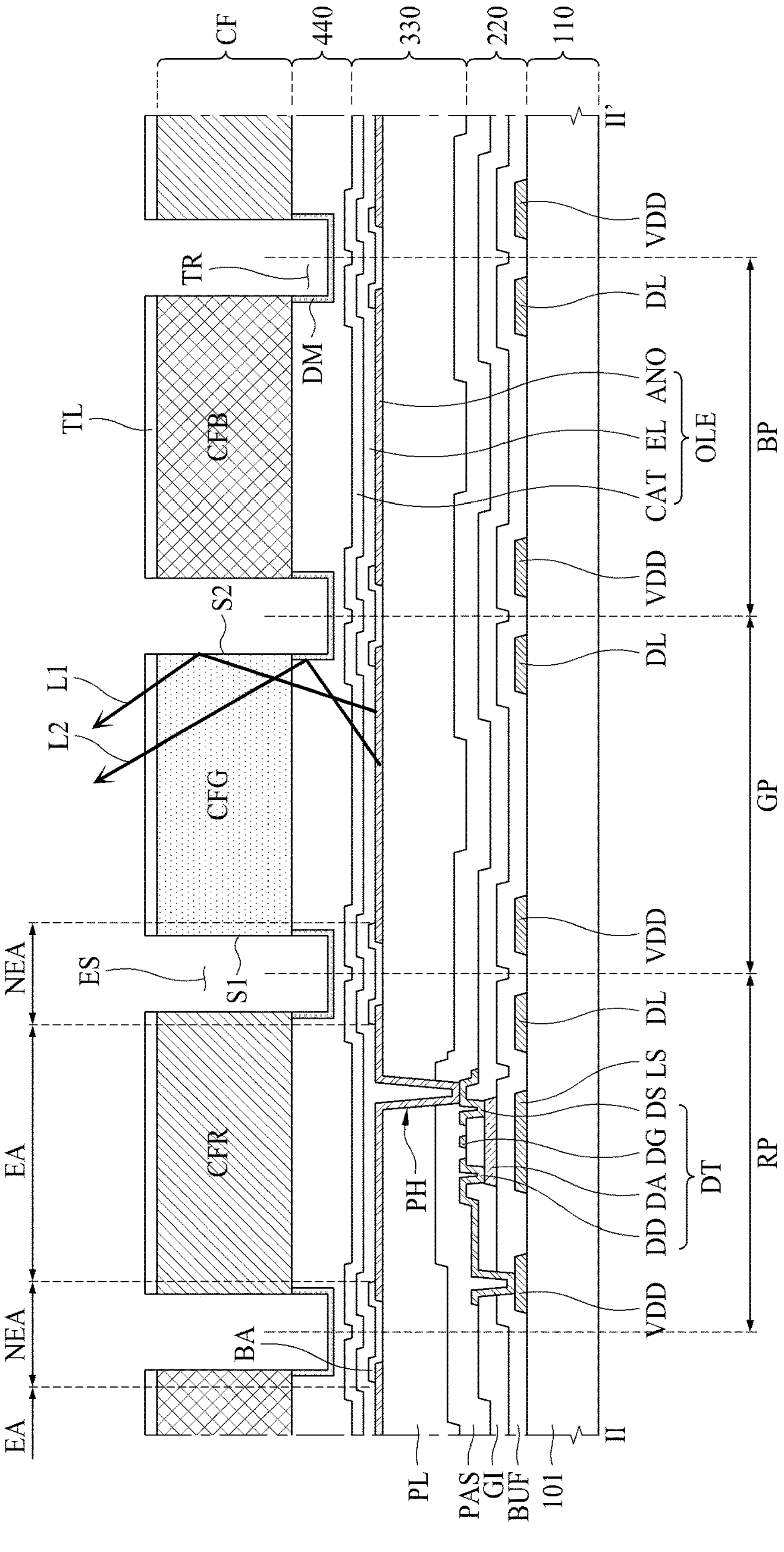
FIG. 14 is an enlarged cross-sectional view, cutting along line II-II' of FIG. 3, for illustrating a structure of three pixels sequentially arrayed in a light emitting display device according to a tenth embodiment of the present disclosure.

Referring to FIG. 14, the light emitting display device according to the tenth embodiment of the present disclosure has an almost same structure to the light emitting display device according to the first embodiment of the present disclosure. The difference is that the tenth embodiment has a different structure in which a recessed (or well type) dam DM is disposed between color filters CF, i.e., between pixels P, from the structure of the first embodiment. In addition, the color filter CF has a rectangular shape rather than trapezoidal shape.

In detail, the trench TR is formed at the encapsulation layer 440 between the pixel P and pixel P. The recessed dam DM is formed in the trench TR. The recessed dam DM can have a thin wall structure which is stacked along the side wall surface and bottom surface of the trench TR.

The trench TR and the recessed dam DM are elements for forming the empty space ES by separating the color filters CF by a predetermined distance. In the tenth embodiment, the color filter CF has a rectangular shape. For example, The left side surface S1 and the right side surface S2 of the color filter CF are formed as being parallel to a vertical surface with respect to the upper surface of the encapsulation layer 440. Referring to the first light path L1, the light emitted from the pixel P to the inside of the color filter CF can be reflected by an interface between the color filter CF having a high refractive index and the empty space ES having a low refractive index, so the light can be condensed within the pixel P itself.

The recessed dam DM can be formed of a metal material. In particular, the recessed dam DM can be formed of a metal material having excellent light reflectance. Accordingly, referring to the second light path L2, when light emitted from the emission layer EL reaches the recessed dam DM, it can be reflected by the color filter CF disposed in the pixel P itself. As a result, it is possible to perform the same function as the black matrix preventing color mixing problem between the pixels P. Moreover, the black matrix BM described in the second embodiment performs only the function of preventing color mixing problem, but the recessed dam DM of the tenth embodiment can further improve light efficiency by reflecting light which can pass to a neighboring pixel P back to its own pixel P.

The light emitting display device according to the tenth embodiment can improve light condensing efficiency in the front direction of the display device, and can prevent light leakage and color mixing problems. In addition, since higher luminance can be obtained with the same power consumption, low power driving can be acquired.

Eleventh Embodiment

Hereinafter, referring to FIG. 15, a light emitting display device according to an eleventh embodiment of the present disclosure will be explained. Particularly, FIG. 15 is an enlarged cross-sectional view, cutting along line II-II' of FIG. 3, for illustrating a structure of three pixels sequentially arrayed in a light emitting display device according to an eleventh embodiment of the present disclosure.

Figure 15:
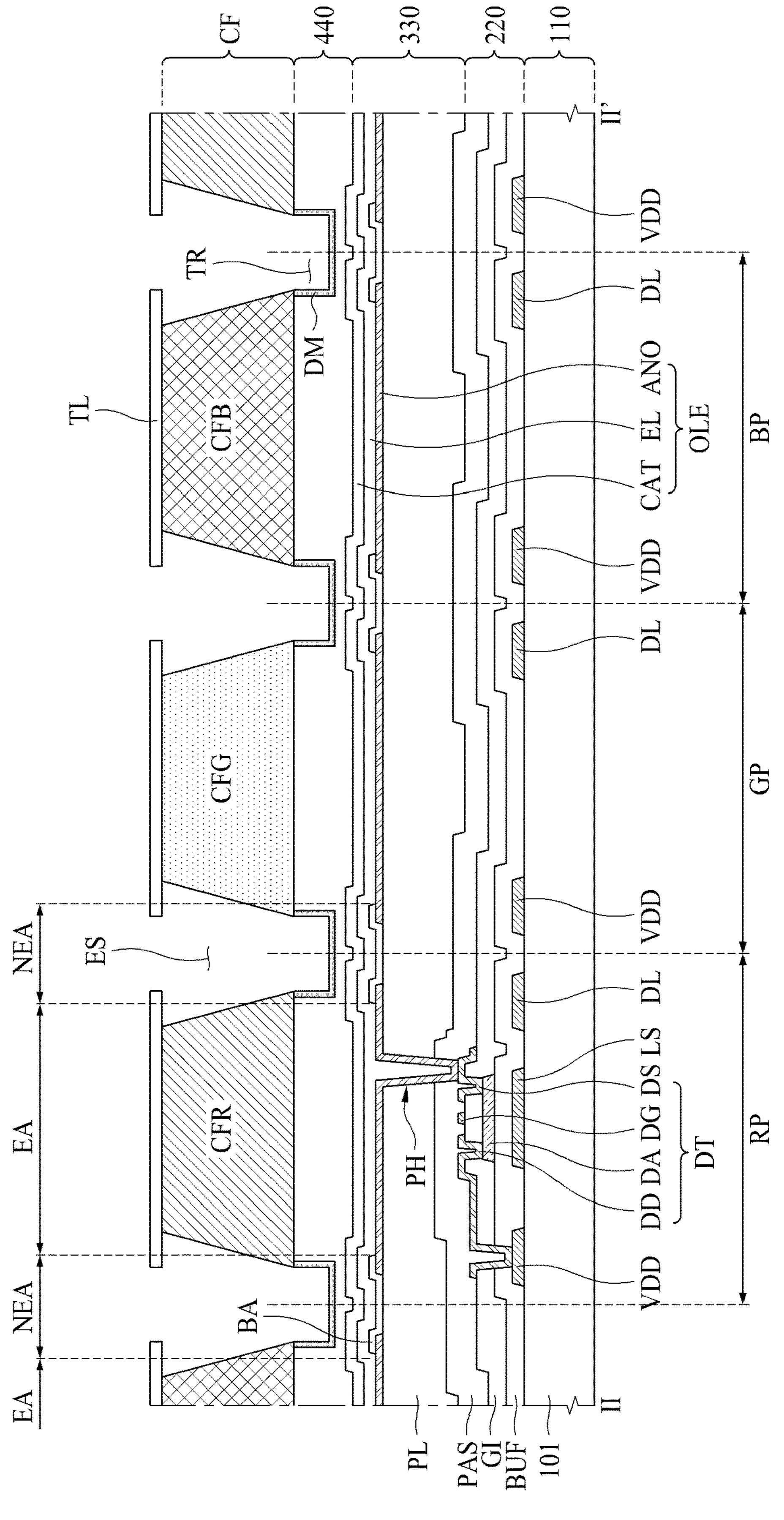
FIG. 15 is an enlarged cross-sectional view, cutting along line II-II' of FIG. 3, for illustrating a structure of three pixels sequentially arrayed in a light emitting display device according to an eleventh embodiment of the present disclosure.

Referring to FIG. 15, the light emitting display device according to the eleventh embodiment of the present disclosure has an almost same structure to the light emitting display device according to the first embodiment of the present disclosure. The difference is that the eleventh embodiment has a different structure in which a recessed (or well type) dam DM is disposed between color filters CF, i.e., between pixels P, from the structure of the first embodiment. For example, the eleventh embodiment provides a structure in which the structure of the encapsulation layer 440 according to the tenth embodiment is combined with the structure of the color filter CF according to the first embodiment.

In detail, the trench TR is formed at the encapsulation layer 440 between the pixel P and pixel P. The recessed dam DM is formed in the trench TR. The recessed dam DM can have a thin wall structure which is stacked along the side wall surface and bottom surface of the trench TR.

The trench TR and the recessed dam DM are elements for forming the empty space ES by separating the color filters CF by a predetermined distance. In the tenth embodiment, the color filter CF has a trapezoidal shape. Since an empty space ES, i.e., air layer, is disposed between the color filters CF, the light emitted from the pixel P to the inside of the color filter CF can be reflected by an interface between the color filter CF having a high refractive index and the empty space ES having a low refractive index, so the light can be condensed within the pixel P itself.

The recessed dam DM can be formed of a metal material having excellent light reflectance. Accordingly, when light emitted from the emission layer EL reaches the recessed dam DM, it can be reflected by the color filter CF disposed in the pixel P itself. As a result, it is possible to perform the same function as the black matrix preventing color mixing problem between the pixels P. Moreover, the recessed dam DM of the tenth embodiment can further improve light efficiency by reflecting light which can pass to a neighboring pixel P back to its own pixel P.

The light emitting display device according to the eleventh embodiment can improve light condensing efficiency in the front direction of the display device, and can prevent light leakage and color mixing problems. In addition, since higher luminance can be obtained with the same power consumption, low power driving can be acquired.

Twelfth Embodiment

Hereinafter, referring to FIGS. 16A and 16B, a light emitting display device according to a twelfth embodiment of the present disclosure will be explained. Particularly, FIGS. 16A and 16B are enlarged cross-sectional views, cutting along line II-II' of FIG. 3, for illustrating a structure of three pixels sequentially arrayed in a light emitting display device according to a twelfth embodiment of the present disclosure.

Figure 16A:
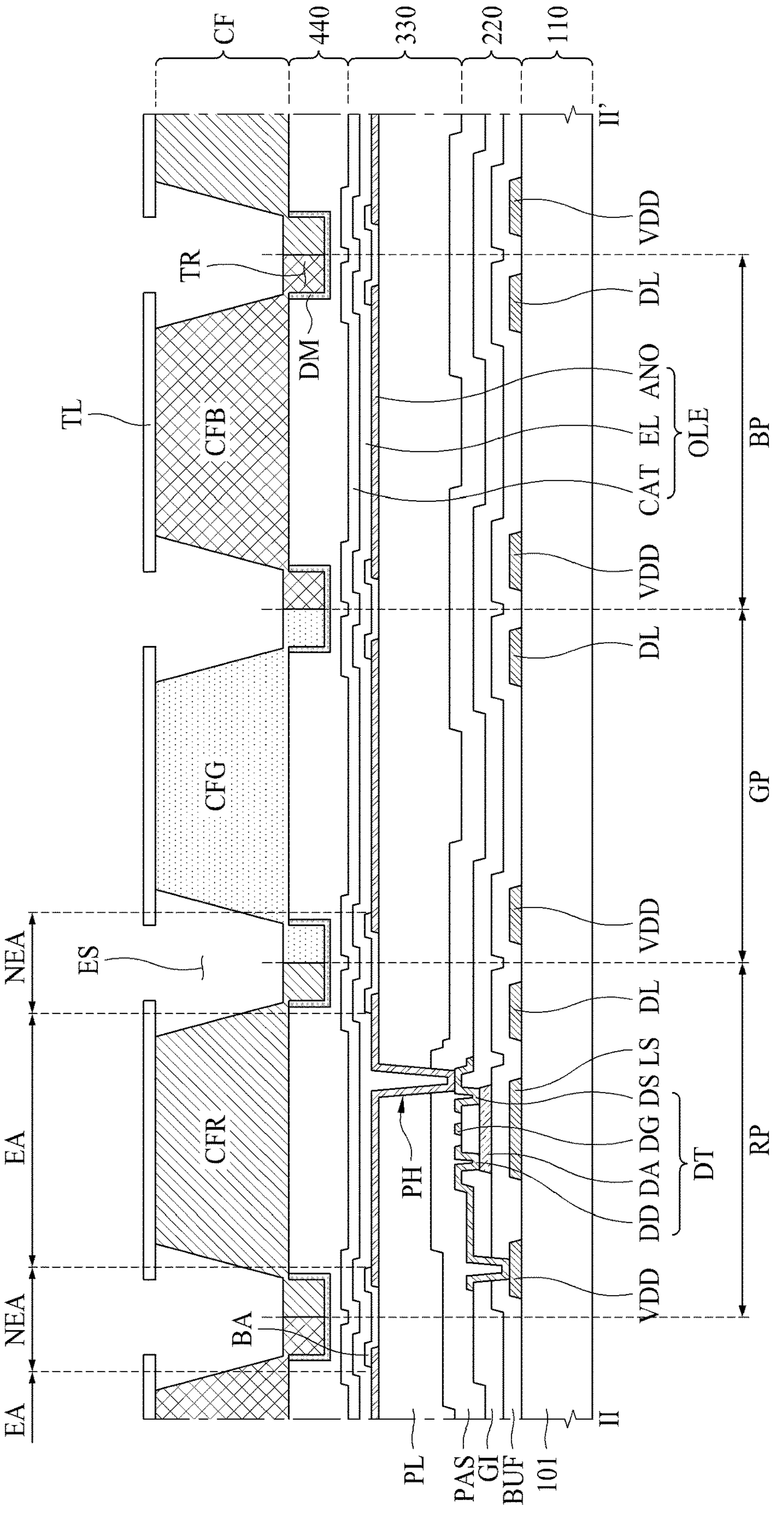
FIGS. 16A and 16B are enlarged cross-sectional views, cutting along line II-II' of FIG. 3, for illustrating a structure of three pixels sequentially arrayed in a light emitting display device according to a twelfth embodiment of the present disclosure.

Referring to FIG. 16A, the light emitting display device according to the twelfth embodiment of the present disclosure has an almost same structure to the light emitting display device according to the eleventh embodiment of the present disclosure. The difference is that the twelfth embodiment has a structure in which the color filter CF remains inside the recessed dam DM in the structure of the eleventh embodiment.

In detail, inside of the recessed dam DM, color filters CF allocated at each of two neighboring pixels P are disposed by half and half. For example, referring to FIG. 16A, inside the recessed dam DM disposed between the red pixel RP and the green pixel GP, the red color filter CFR and the green color filter CFG are filled in. The red color filter CFR in the recessed dam DM is disposed adjacent to the red pixel RP, and the green color filter CFG in the recessed dam DM is disposed adjacent to the green pixel GP.

Figure 16B:
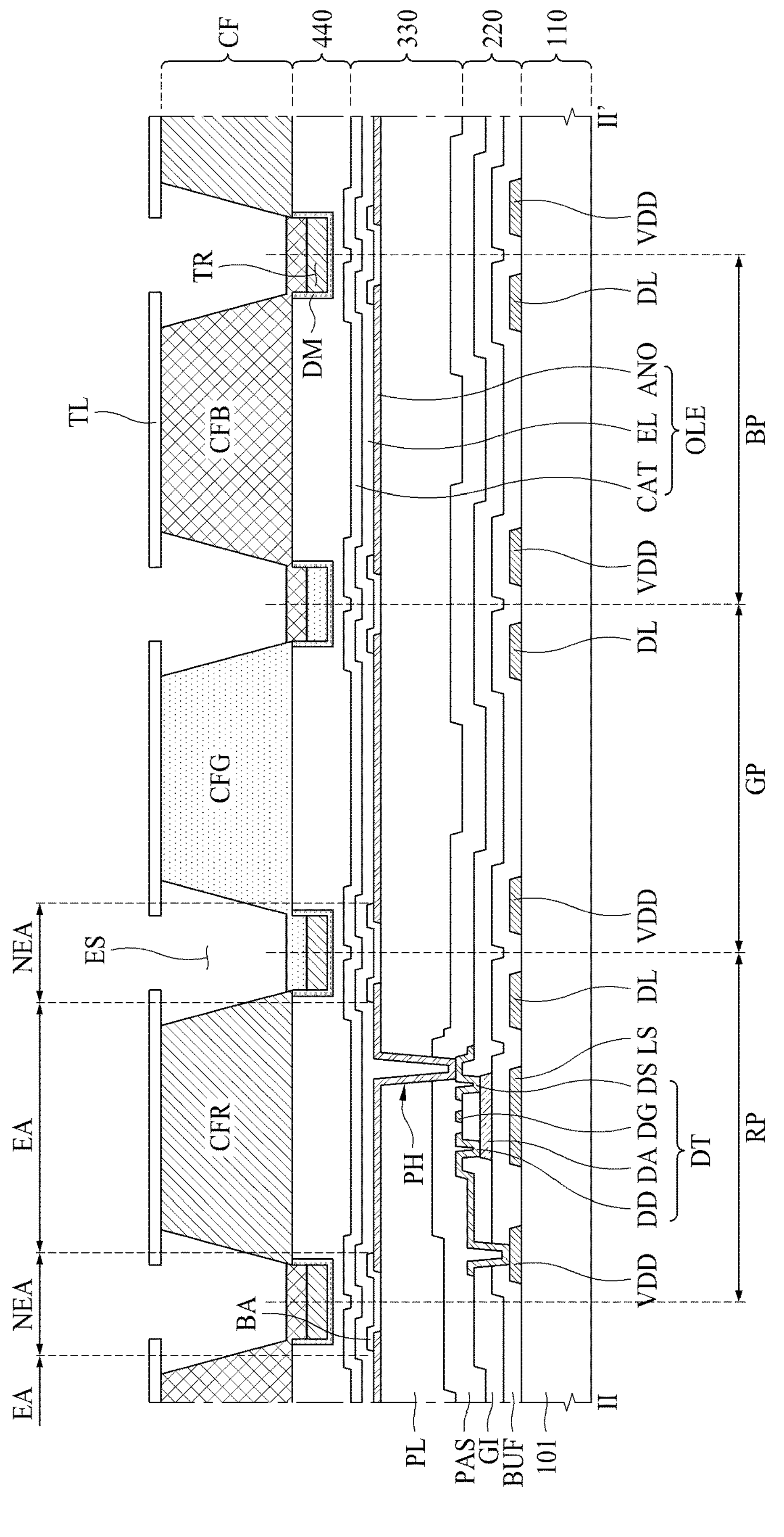

As another example, referring to FIG. 16B, the red color filter CFR and the green color filter CFG are filled in the recessed dam DM disposed between the red pixel RP and the green pixel GP. The red color filter CFR is firstly stacked on the bottom surface of the recessed dam DM, and then the green color filter CFG is stacked on the red color filter CFR. The stacking order of the color filters CF can vary depending on which color filter CF is to be formed first.

The recessed dam DM can be formed of a metal material having excellent light reflectance. Accordingly, when light emitted from the emission layer EL reaches the recessed dam DM, it can be reflected by the color filter CF disposed in the pixel P itself. As a result, it is possible to perform the same function as the black matrix preventing color mixing problem between the pixels P. Moreover, the recessed dam DM of the tenth embodiment can further improve light efficiency by reflecting light which can pass to a neighboring pixel P back to its own pixel P.

In the interim, as the external light such as sunlight or ambient light, from the outside is reflected by the recessed dam DM, the user observing the display device may not normally acknowledge the video image provided by the display device. However, in the twelfth embodiment, as the color filters CF are filled inside the recessed dam DM, almost of the reflection of the external light can be remarkably reduced.

The light emitting display device according to the twelfth embodiment can improve light condensing efficiency in the front direction of the display device, and can prevent light leakage and color mixing problems. In addition, since higher luminance can be obtained with the same power consumption, low power driving can be acquired. In addition, as the color filters CF are filled in the inner space of the recessed dam DM, the deterioration of the display quality due to reflection of the external light can be prevented.

Thirteenth Embodiment

Hereinafter, referring to FIG. 17, a light emitting display device according to a thirteenth embodiment of the present disclosure will be explained. More specifically, FIG. 17 is an enlarged cross-sectional view, cutting along line II-II' of FIG. 3, for illustrating a structure of three pixels sequentially arrayed in a light emitting display device according to a thirteenth embodiment of the present disclosure.

Figure 17:
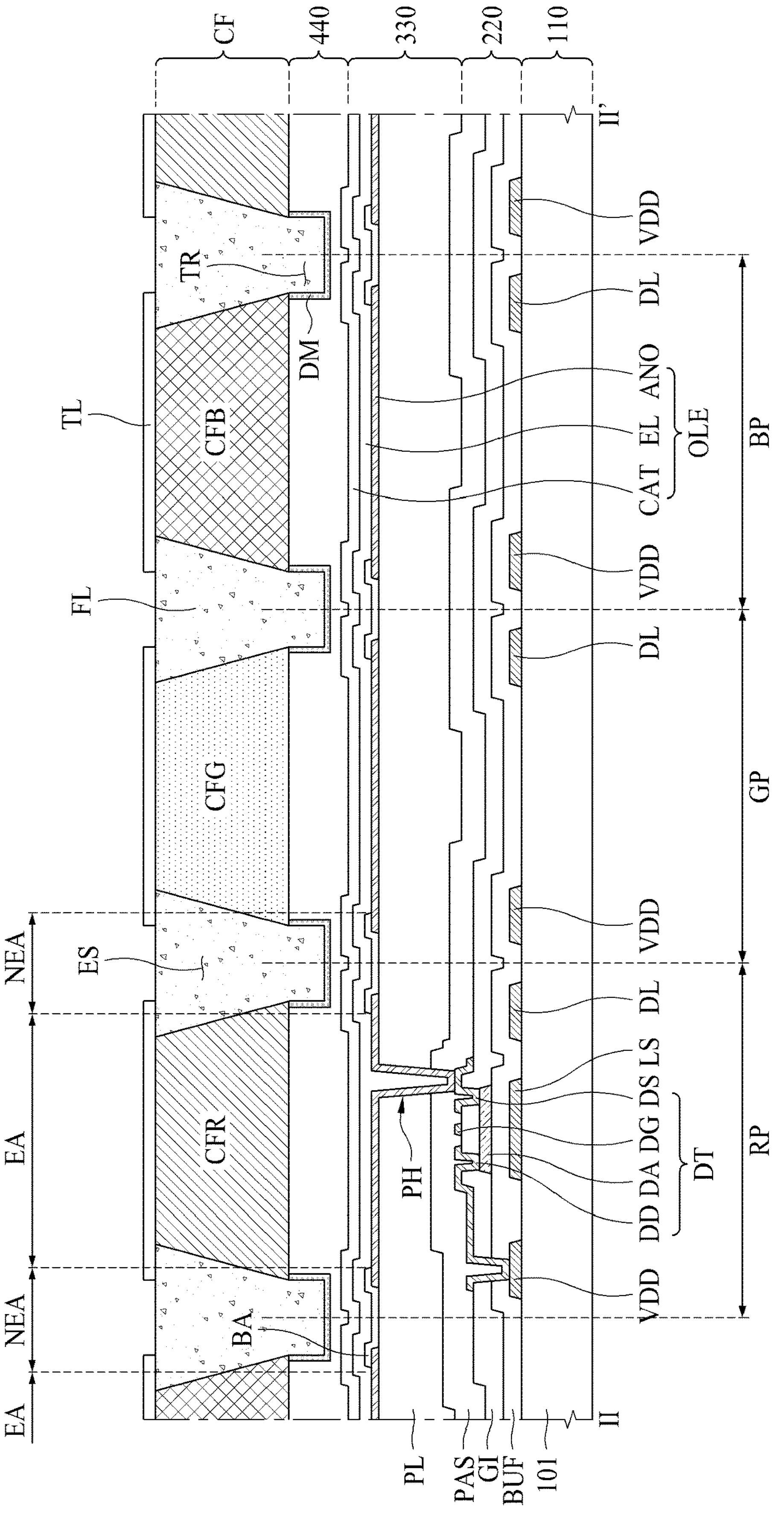
FIG. 17 is an enlarged cross-sectional view, cutting along line II-II' of FIG. 3, for illustrating a structure of three pixels sequentially arrayed in a light emitting display device according to a thirteenth embodiment of the present disclosure.

Referring to FIG. 17, the light emitting display device according to the thirteenth embodiment of the present disclosure has an almost same structure to the light emitting display device according to the eleventh embodiment of the present disclosure. The difference is that the thirteenth embodiment has a structure in which a filling layer FL is further disposed inside the recessed dam DM and the trench TR in the structure of the eleventh embodiment. The filling layer FL can be an element for preventing wing portions of the transparent layer TL from being damaged and for enhancing the structural stability of the color filters CF.

In detail, the filling layer FL is a material that fills the empty space EX disposed between the color filters CF having a high refractive index, and fills the trench TR which is a recessed inner space of the recessed dam DM, so the filling layer FL preferably has a lower refractive index than the color filter CF and the transparent layer TL. For example, the filling layer FL is preferably formed of a transparent material having a refractive index of 1.0 to 1.2. But embodiments of the present disclosure are not limited thereto. The filling layer FL is preferably made of an organic material which has excellent fluidity to fill the empty space ES and the inside of the trench TR through the separation gap between the transparent layers TL, and is hardened by an ultra-violet light reaction after filling the empty space ES and the trench TR. However, embodiments of the present disclosure not limited thereto. As another example, the filling layer FL can be formed of an organic material having excellent light absorbing and being opaque.

The light emitting display device according to the thirteenth embodiment can improve light condensing efficiency in the front direction of the display device, and can prevent light leakage and color mixing problems. In addition, since higher luminance can be obtained with the same power consumption, low power driving can be acquired.

Fourteenth Embodiment

Hereinafter, referring to FIG. 18, a light emitting display device according to a fourteenth embodiment of the present disclosure will be explained. More specifically, FIG. 18 is an enlarged cross-sectional view, cutting along line II-II' of FIG. 3, for illustrating a structure of three pixels sequentially arrayed in a light emitting display device according to a fourteenth embodiment of the present disclosure.

Figure 18:
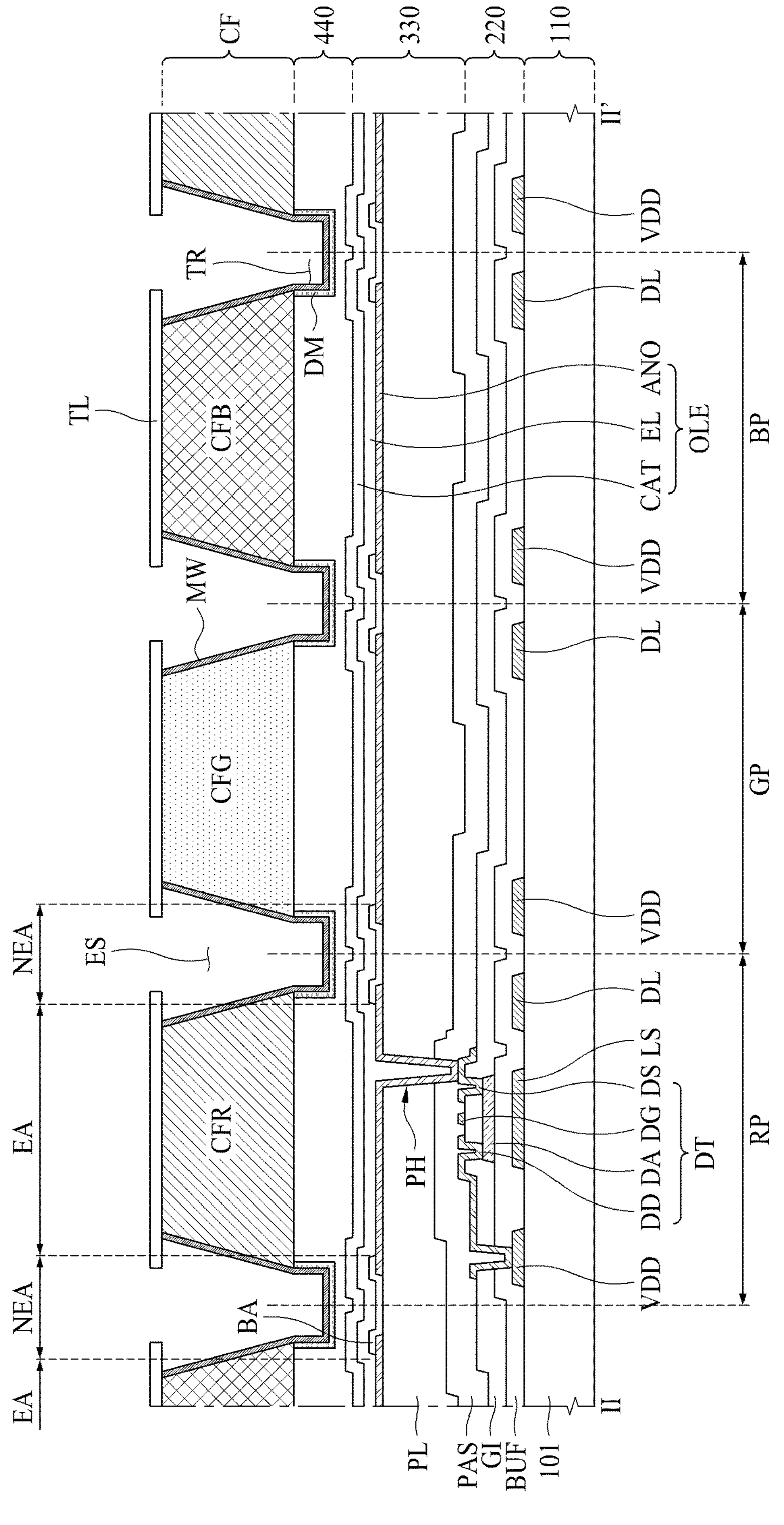
FIG. 18 is an enlarged cross-sectional view, cutting along line II-II' of FIG. 3, for illustrating a structure of three pixels sequentially arrayed in a light emitting display device according to a fourteenth embodiment of the present disclosure.

Referring to FIG. 18, the light emitting display device according to the fourteenth embodiment of the present disclosure has an almost same structure to the light emitting display device according to the eleventh embodiment of the present disclosure. The difference is that the fourteenth embodiment has a structure in which a metal layer MW is further disposed at the inner surface of the recessed dam DM and at the side surface between the color filters CF.

For example, the metal layer MW can be made of a metal material having excellent reflectance. The metal layer MW is preferably deposited on the out wall surface of the color filter CF having a high refractive index, and on the inner wall surface of the trench TR which is a recessed inner space of the recessed dam DM. But embodiments of the present disclosure are not limited thereto.

The metal layer MW is formed on the surface of the color filter CF patterned to corresponding to the shape of the pixel P, and the recessed dam DM formed inside the trench TR formed in the encapsulation layer 440. All of the light emitted from the pixel P traveling in a direction outside the corresponding pixel P can be reflected into the corresponding pixel P. As a result, it is possible to perform the same function as the black matrix preventing color mixing problem between the pixels P. Moreover, the recessed dam DM of the tenth embodiment can further improve light efficiency by reflecting light which can pass to a neighboring pixel P back to its own pixel P.

Further, inside the empty space ES and the trench TR between the metal layers MW can be filled or coated with a protective material to prevent the metal layer MW from being oxidized and/or damaged due to contact with air. Alternatively, as in the twelfth embodiment and thirteen embodiment, the inside the empty space ES and the trench TR between the metal layers MW can be filled with a color filter CF or a low refractive material.

The light emitting display device according to the fourteenth embodiment can improve light condensing efficiency in the front direction of the display device, and can prevent light leakage and color mixing problems. In addition, since higher luminance can be obtained with the same power consumption, low power driving can be acquired.

In various embodiments of the present disclosure, the transparent layer TL can include the wing parts that overhang the color filter CF and the main part that contacts the color filter CF. In this context, a thickness of the wing parts and a thickness of the main part can be similar or the same. But embodiments of the present disclosure are not limited thereto. For example, in other embodiments of the present disclosure, the thickness of the wing parts can be different from the thickness of the main part.

For example, the thickness of the main part can be greater than or less than that of the wing parts when the light emission pattern PT is present at the main part and not at the wing parts. When the light emission pattern PT is a concave pattern, the main part at the concave pattern can be thinner than the wing parts. On the other hand, when the light emission pattern PT is a convex pattern, the man part at the convex pattern can be thicker than the wing parts.

Also, the thickness of the wing parts can be different from the thickness of the main when the wing parts of the transparent layer TL have one or more extensions that extend downward towards the left side surface S1 and the right side surface S2 to contact the sides surfaces of the color filter CF. In such embodiments, the extensions can provide a support for the transparent layer TL at the overhang of the transparent layer TL.

In various embodiments of the present disclosure, the interval between adjacent color filters CF is shown as being an empty space, an air layer, or filled. But embodiments of the present disclosure are not limited thereto. For example, the interval between the adjacent color filters CF can be a combination of the empty space, the air layer, or filled. For example, the interval can include at least one of the empty space, the air layer, and be filled. In one example, the interval between the adjacent color filters CF can include both a space and a filler. For example, the filler can be provided at a middle of the interval and the space can be provided between the filler and the color filters CF on opposite sides of the filler. On the other hand, the middle of the interval be provided with an empty space, and the filler can be provided between the empty space and the color filters CF on opposite sides of the empty space. Meanwhile, the interval can be provided with a filler than contacts the side surfaces of the color filters CF and an upper surface of the encapsulation layer 440, and an empty space can be provided at the middle of the interval. In various embodiments of the present disclosure, the empty space can be filled with air, gas or fluid, or a different filler from the filler. In other embodiments of the present disclosure the empty space can have a vacuum. Also, the empty space can be located in an interior of the filler when the filler is located in the interval. The at least one of the empty space, the air layer, and the filler can arranged in the horizontal direction or the vertical direction in various order. The arrangement of the at least one of the empty space, the air layer, and the filler in the interval between the color filters CF can be based on the refractive index of each of the empty space, the air layer to improve light efficiency. In various embodiments of the present disclosure, the empty space, even when filled, does not extend beyond the transparent layer TL. Also, a length of the transparent layer TL is equal to or less than a length of the color filter CF in a same direction.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment can be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. A light emitting display device comprising:

a pixel disposed on a substrate;

a driving element layer including a thin film transistor disposed in the pixel;

a light emitting element layer disposed in the pixel on the driving element layer, and connected to the thin film transistor;

an encapsulation layer disposed on the light emitting element layer;

a color filter disposed on the encapsulation layer at the pixel, wherein a space is located at a side of the color filter; and a transparent layer disposed on the color filter, wherein the color filter includes:

a first surface contacting the encapsulation layer, and having a first area; and a second surface contacting the transparent layer, and having a second area smaller than the first area.

2. The light emitting display device according to claim 1, wherein the color filter has any one of a trapezoidal shape, a semi-circular shape and a semi-elliptical shape in which a lower surface is wider than an upper surface.

3. The light emitting display device according to claim 1, wherein the color filter further includes:

a side surface connecting the first surface to the second surface, and forming an acute angle with the first surface.

4. The light emitting display device according to claim 1, wherein the space includes an air layer, and wherein the transparent layer has a refractive index between a refractive index of the color filter and a refractive index of the air layer.

5. The light emitting display device according to claim 1, further comprising:

a black matrix overlapping a lower edge side of the color filter on the encapsulation layer.

6. The light emitting display device according to claim 1, wherein the transparent layer further includes at least one of a light scattering pattern and a light scattering material.

7. The light emitting display device according to claim 5, further comprising:

an upper protection layer disposed on the transparent layer.

8. The light emitting display device according to claim 7, wherein the space includes an air layer, and wherein the upper protection layer has a refractive index between a refractive index of the transparent layer and a refractive index of the air layer.

9. The light emitting display device according to claim 8, further comprising:

a filling layer in an inside of the space, wherein the filling layer has a refractive index less than refractive indices of the color filter and the transparent layer.

10. A light emitting display device comprising:

a first pixel and a second pixel disposed adjacent to each other on a substrate;

a first color filter disposed at the first pixel on the substrate;

a second color filter disposed at the second pixel on the substrate, and spaced apart from the first color filter;

a first transparent layer disposed on the first color filter;

a second transparent layer disposed on the second color filter; and an encapsulation layer, wherein a space is located between the first color filter and the second color filter, and wherein each of the first color filter and the second color filter includes:

a first surface contacting the encapsulation layer, and having a first area; and a second surface contacting the respective first or second transparent layer, and having a second area smaller than the first area.

11. The light emitting display device according to claim 10, wherein the first transparent layer and the second transparent layer have refractive indices between refractive indices of the first color filter and the second color filter and a refractive index of the space.

12. The light emitting display device according to claim 10, further comprising:

a black matrix disposed between the first color filter and the second color filter on the substrate; and a link portion connecting the first transparent layer and the second transparent layer.

13. The light emitting display device according to claim 12, wherein the link portion has a width of approximately 20% to 30% compared to a length of sides of the first transparent layer and the second transparent layer facing each other.

14. The light emitting display device according to claim 10, wherein the first transparent layer and the second transparent layer include at least one of a light scattering pattern and a light scattering material.

15. The light emitting display device according to claim 10, further comprising:

an upper protection layer continuously disposed over upper surfaces of the first transparent layer and the second transparent layer.

16. The light emitting display device according to claim 10, further comprising:

a filling layer in the space located between the first color filter and the second color filter, and under the first transparent layer and the second transparent layer.

17. The light emitting display device according to claim 16, wherein the space includes an air layer, and wherein the filling layer has a refractive index between refractive indices of the first transparent layer and the second transparent layer and a refractive index of the air layer.

18. The light emitting display device according to claim 10, wherein the encapsulation layer is disposed between the substrate and the first color filter, and between the substrate and the second color filter, and wherein the light emitting display device further comprises:

a trench disposed at the encapsulation layer between the first pixel and the second pixel; and a recessed dam disposed at a bottom surface and an inside side surface of the trench.

19. A light emitting display device comprising:

a pixel disposed on a substrate;

a driving element layer including a thin film transistor disposed in the pixel;

a light emitting element layer connected to the thin film transistor;

an encapsulation layer disposed on the light emitting element layer;

a color filter disposed on the encapsulation layer at the pixel; and a transparent layer disposed on the color filter, wherein the color filter includes:

a first surface contacting the encapsulation layer, and having a first area; and a second surface contacting the transparent layer, and having a second area smaller than the first area, and wherein a length of the transparent layer is equal to or less than a length of the color filter in a same direction.

20. The light emitting display device according to claim 19, wherein the transparent layer includes a main part in contact with the color filter and wing parts overhanging the color filter, and the wing parts are located at a periphery of the main part.

21. The light emitting display device according to claim 20, wherein a thickness of the wing parts is different from a thickness of the main part.

* * * * *